(12) United States Patent
Takeuchi et al.

(10) Patent No.: US 11,656,122 B2
(45) Date of Patent: May 23, 2023

(54) PHOTON DETECTION DEVICE

(71) Applicants: National University Corporation YOKOHAMA National University, Yokohama (JP); National Institute of Information and Communications Technology, Koganei (JP)

(72) Inventors: Naoki Takeuchi, Yokohama (JP); Shigehito Miki, Koganei (JP); Hirotaka Terai, Koganei (JP)

(73) Assignees: NATIONAL UNIVERSITY CORPORATION YOKOHAMA NATIONAL UNIVERSITY, Yokohama (JP); NATIONAL INSTITUTE OF INFORMATION AND COMMUNICATIONS TECHNOLOGY, Koganei (JP)

( * ) Notice: Subject to any disclaimer, the term of this patent is extended or adjusted under 35 U.S.C. 154(b) by 0 days.

(21) Appl. No.: 17/310,931

(22) PCT Filed: Feb. 26, 2020

(86) PCT No.: PCT/JP2020/007558
§ 371 (c)(1),
(2) Date: Aug. 31, 2021

(87) PCT Pub. No.: WO2020/179554
PCT Pub. Date: Sep. 10, 2020

(65) Prior Publication Data
US 2022/0136895 A1     May 5, 2022

(30) Foreign Application Priority Data

Mar. 1, 2019 (JP) .............................. JP2019-037650
May 13, 2019 (JP) .............................. JP2019-090365

(51) Int. Cl.
*G01J 1/44* (2006.01)

(52) U.S. Cl.
CPC ......... *G01J 1/44* (2013.01); *G01J 2001/4446* (2013.01)

(58) Field of Classification Search
CPC ................. G01J 1/44; G01J 2001/4446; G01J 2001/442; G01J 2001/448; H01L 39/22
See application file for complete search history.

(56) References Cited

U.S. PATENT DOCUMENTS

| 9,443,576 B1* | 9/2016 | Miller | ...................... G11C 11/44 |
| 2018/0350411 A1* | 12/2018 | Ware | ........................ G11C 7/04 |
| 2019/0049294 A1* | 2/2019 | Miki | ......................... G01J 1/44 |

FOREIGN PATENT DOCUMENTS

| JP | 2009232311 A | * | 10/2009 |
| JP | 2009232311 A | | 10/2009 |
| JP | 2017142146 A | | 8/2017 |

\* cited by examiner

*Primary Examiner* — Kevin K Pyo
(74) *Attorney, Agent, or Firm* — McCoy Russell LLP

(57) ABSTRACT

A photon detection device according to an aspect of the present invention includes: a superconducting photon detector array in which a plurality of superconducting photon detectors (SPDs) are arranged; a plurality of first transmission lines connected to the plurality of SPDs and configured to transmit a detection current output from each of the plurality of SPDs; an address information generation circuit connected to the plurality of first transmission lines and configured to generate, based on the detection current, an address information signal that specifies a superconducting photon detector from which the detection current is output; a second transmission line magnetically coupled to all of the plurality of first transmission lines; and a time information generation circuit connected to the second transmission line and configured to generate, based on the detection current, (Continued)

a time information signal indicating a time at which a photon is incident on the plurality of superconductive photon detection SPDs.

19 Claims, 20 Drawing Sheets

PHOTON DETECTION DEVICE

CROSS REFERENCE TO RELATED APPLICATIONS

The present application is a U.S. National Phase of International Application No. PCT/JP2020/007558 entitled "PHOTON DETECTION DEVICE," and filed on Feb. 26, 2020. International Application No. PCT/JP2020/007558 claims priority to Japanese Patent Application No. 2019-037650 filed on Mar. 1, 2019 and to Japanese Patent Application No. 2019-090365 filed on May 13, 2019. The entire contents of each of the above-listed applications are hereby incorporated by reference for all purposes.

TECHNICAL FIELD

The present disclosure relates to a photon detection device, and a photon detection device including a plurality of superconducting photon detectors.

BACKGROUND AND SUMMARY

Superconducting photon detectors such as superconducting nanowire single photon detectors (SSPD) and superconducting transition edge sensors (TES) are attracting attention. Such superconducting photon detectors have excellent performance, for example, high detection efficiency, high time resolution, and low dark count rate as compared with semiconductor photon detectors such as avalanche photodiodes. Therefore, the superconducting photon detectors are expected to be used in various fields, for example, quantum information and communication, satellite optical communication, LIDAR (Light Detection And Ranging), and fluorescence imaging.

In recent years, a photon detection device has been studied in which a plurality of superconducting photon detectors (for example, SSPD elements) are arranged in a matrix. Here, since operating at an extremely low temperature of about several K, the superconducting photon detector is housed in a cryocooler. As the number of superconducting photon detectors increases, the number of transmission lines (signal lines) for transmitting detection signals from the respective superconducting photon detectors also increases. There is a problem that when the number of transmission lines taken out of the cryocooler increases, a temperature inside the cryocooler rises due to heat conduction.

In regard to such a problem, according to Patent Literature 1, a signal processing circuit configured by a superconducting logic circuit such as an SFQ (Single-Flux-Quantum) circuit is provided inside a cryocooler to reduce the number of transmission lines taken out of the cryocooler.

Further, according to Patent Literature 2, a signal processing circuit is divided into a time information generation circuit and an address information generation circuit in order to prevent deterioration of low jitter characteristics of SSPD elements. Specifically, transmission lines connected to a plurality of superconducting photon detectors are branched into two parts, one part being connected to a time information generation circuit, the other part being connected to an address information generation circuit. The time information generation circuit generates a time information signal indicating a time at which a photon is incident on the plurality of superconducting photon detectors, and the address information generation circuit generates an address information signal that specifies the superconducting photon detector in which the photon is detected.

CITATION LIST

Patent Literature

Patent Literature 1: Japanese Unexamined Patent Application Publication No. 2009-232311
Patent Literature 2: Japanese Unexamined Patent Application Publication No. 2017-142146

Technical Problem

However, according to Patent Literature 2 as described above, the transmission lines connected to the superconducting photon detectors are branched into two parts. Therefore, the number of transmission lines identical to the number of the transmission lines to be input to the address information generation circuit is also input to the time information generation circuit. As a result, there are problems that a circuit scale of the time information generation circuit is large and power consumption is also high.

Further, as described above, the photon detection devices disclosed in Patent Literatures 1 and 2 include a signal processing circuit configured by a superconducting logic circuit. Therefore, there are problems that a circuit scale is large and power consumption is also high.

The present disclosure has been made in view of such circumstances, and is to provide a photon detection device having a smaller circuit scale and lower power consumption.

Solution to Problem

A photon detection device according to one aspect of the present disclosure includes:
a superconducting photon detector array in which a plurality of superconducting photon detectors are arranged;
a plurality of first transmission lines connected to the plurality of superconducting photon detectors and configured to transmit a detection current output from each of the plurality of superconducting photon detectors;
an address information generation circuit connected to the plurality of first transmission lines and configured to generate, based on the detection current, an address information signal that specifies a superconducting photon detector from which the detection current is output;
a second transmission line magnetically coupled to all of the plurality of first transmission lines; and
a time information generation circuit connected to the second transmission line and configured to generate, based on the detection current, a time information signal indicating a time at which a photon is incident on the plurality of superconducting photon detectors.

The second transmission line may include a plurality of direct-current SQUID elements, and the second transmission line may be magnetically coupled to the plurality of first transmission lines via the plurality of direct-current SQUID elements. Here, each of the plurality of direct-current SQUID elements may include an inductor between a pair of Josephson junctions, each of the plurality of first transmission lines may be provided with an inductor, and the inductor of the direct-current SQUID element and the inductor of the first transmission line may be magnetically coupled to each other.

The time information generation circuit may include a logic circuit configured only by a DC-driven superconducting logic circuit. Here, the DC-driven superconducting logic circuit may be an RSFQ circuit.

The address information generation circuit may include a plurality of analog-to-digital converters connected to the plurality of first transmission lines, and the analog-to-digital converter may include a logic circuit configured only by an AC-driven superconducting logic circuit. Here, the AC-driven superconducting logic circuit may be an AQFP circuit.

In addition, the superconducting photon detector may be an SSPD element.

A photon detection device according to another aspect of the present disclosure includes:

a superconducting photon detector array in which a plurality of superconducting photon detectors are arranged;

a plurality of first transmission lines connected to the plurality of superconducting photon detectors and configured to transmit a detection current output from each of the plurality of superconducting photon detectors;

a second transmission line magnetically coupled to all of the plurality of first transmission lines; and a plurality of delay circuits provided between the first transmission lines adjacent to each other on the second transmission line, wherein according to the detection current, a first pulse signal is output from one end of the second transmission line, and a second pulse signal is output from the other end of the second transmission line, and a superconducting photon detector, from which the detection current is output, is capable of being specified based on a difference between output times of the first and second pulse signals, and a generation time of the detection current is capable of being specified based on a sum of the output times of the first and second pulse signals.

A photon detection device according to still another aspect of the present disclosure includes:

a superconducting photon detector array in which a plurality of superconducting photon detectors are arranged;

a plurality of first transmission lines connected to the plurality of superconducting photon detectors and configured to transmit a detection current output from each of the plurality of superconducting photon detectors;

a pair of second transmission lines magnetically coupled to all of the plurality of first transmission lines; and a plurality of delay circuits provided between the first transmission lines adjacent to each other on each of the pair of second transmission lines, wherein according to the detection current, a first pulse signal and a second pulse signal are respectively output from one end of each of the pair of second transmission lines, and a superconducting photon detector, from which the detection current is output, is capable of being specified based on a difference between output times of the first and second pulse signals, and a generation time of the detection current is capable of being specified based on a sum of the output times of the first and second pulse signals.

Each of the plurality of first transmission lines may be magnetically coupled to the second transmission line via at least one direct-current SQUID element provided in the second transmission line. Here, each of the plurality of first transmission lines may be magnetically coupled to the second transmission line via a plurality of direct-current SQUID elements provided in the second transmission line. Here, the plurality of direct-current SQUID elements may be connected in series to each other via inductors.

Each of the plurality of direct-current SQUID elements may include an inductor between a pair of Josephson junctions, each of the plurality of first transmission lines may be provided with an inductor, and the inductor of the direct-current SQUID element and the inductor of the first transmission line may be magnetically coupled to each other.

In addition, the superconducting photon detector may be an SSPD element.

Effect of Disclosure

According to the present disclosure, it is possible to provide a photon detection device having a smaller circuit scale and lower power consumption.

DETAILED DESCRIPTION

Specific embodiments of the present disclosure will be described below with reference to the drawings. However, the present disclosure is not limited to embodiments to be described below. Further, the following description and drawings are simplified as appropriate for the sake of clarity of description.

First Embodiment

Configuration of Photon Detection Device

Figure 1:
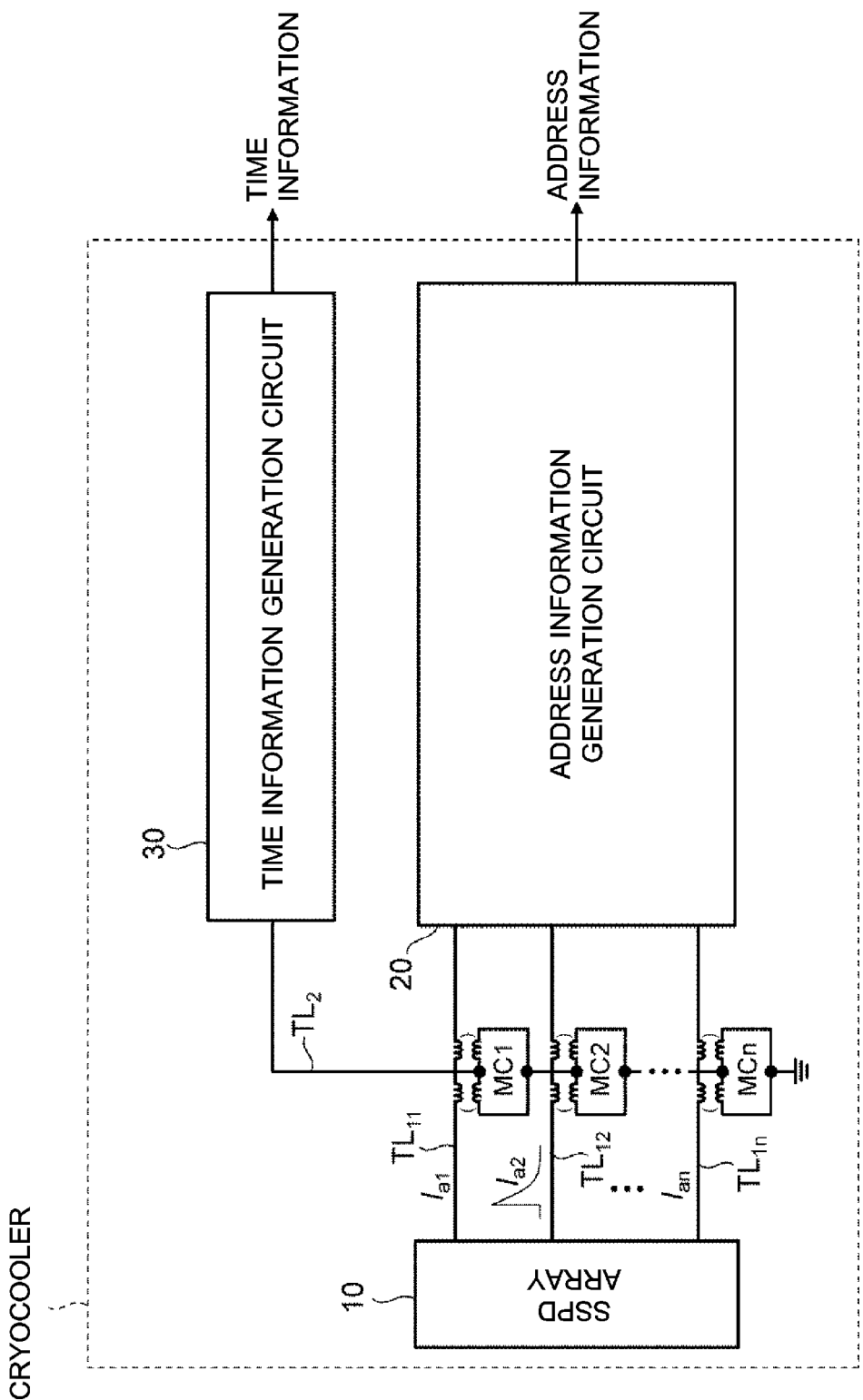
FIG. 1 is a block diagram showing a configuration of a photon detection device according to a first embodiment.

First, a configuration of a photon detection device according to a first embodiment will be described with reference to FIG. 1. FIG. 1 is a block diagram showing a configuration of a photon detection device according to the first embodiment. As shown in FIG. 1, the photon detection device according to the first embodiment includes an SSPD array 10, an address information generation circuit 20, a time information generation circuit 30, n (n being a natural number of 2 or more) first transmission lines TL11 to TL1$n$, and one second transmission line TL2. Further, as shown in FIG. 1, the photon detection device according to the first embodiment is housed in a cryocooler.

The SSPD array 10 includes, for example, a plurality of SSPD elements arranged in a matrix. Each of the SSPD elements includes a meander-shaped superconducting nanowire. When one photon is incident on any region of the superconducting nanowire, the region transitions transiently from a superconducting state to a normal conducting state, and a pulsed detection current is output from the SSPD element.

In addition to the SSPD elements, TES elements or other superconducting photon detectors may be used.

In the example shown in FIG. 1, the plurality of SSPD elements are connected to the first transmission lines TL11 to TLTn. FIG. 1 shows a state in which a pulsed analog detection current Ia2 is output from the SSPD element connected to the first transmission line TL12. When the photon detection device is an image sensor, one SSPD element corresponds to one pixel.

The plurality of SSPD elements forming the SSPD array 10 are connected to the first transmission lines but need not be connected in a one-to-one manner.

The address information generation circuit 20 is connected to the first transmission lines TL11 to TL1$n$. Here, the first transmission lines TL11 to TL1$n$ are connected to the plurality of SSPD elements. In other words, the address information generation circuit 20 generates an address information signal, which specifies the SSPD element on which the photon is incident, based on analog detection currents Ia1 to Ian output from the SSPD elements.

The time information generation circuit 30 is connected to the second transmission line TL2. Here, the second transmission line TL2 is magnetically coupled to all of the n first transmission lines TL11 to TL1$n$ via magnetic coupling elements MC1 to MCn. In other words, the time information generation circuit 30 generates a time information signal indicating a time at which the photon is incident on any of the plurality of SSPD elements, based on the analog detection currents Ia1 to Ian output from the SSPD elements.

For example, as shown in FIG. 1, when the pulsed analog detection current Ia2 is output from the SSPD element connected to the first transmission line TL12, a current transiently flows through the second transmission line TL2 via the magnetic coupling element MC2, and is input to the time information generation circuit 30.

Description of Effects

As described above, in Patent Literature 2, the transmission lines connected to the superconducting photon detectors are branched into two parts. Therefore, the number of transmission lines identical to the number of the transmission lines to be input to the address information generation circuit is also input to the time information generation circuit. As a result, there are problems that the circuit scale of the time information generation circuit is large and the power consumption is also high.

On the other hand, in the photon detection device according to the present embodiment, one second transmission line TL2 is magnetically coupled to all of the n first transmission lines TL11 to TL1$n$ via the magnetic coupling elements MC1 to MCn. In other words, the transmission line connected to the superconducting photon detectors (SSPD elements) is not branched into two parts. Therefore, only one second transmission line TL2 is input to the time information generation circuit 30. As a result, the circuit scale of the time information generation circuit 30 and the power consumption can be significantly reduced as compared with Patent Literature 2.

The number of second transmission lines TL2 is not limited to one, and may be smaller than the number of the first transmission lines TL11 to TL1$n$.

Detailed Configuration of Photon Detection Device

Figure 2:
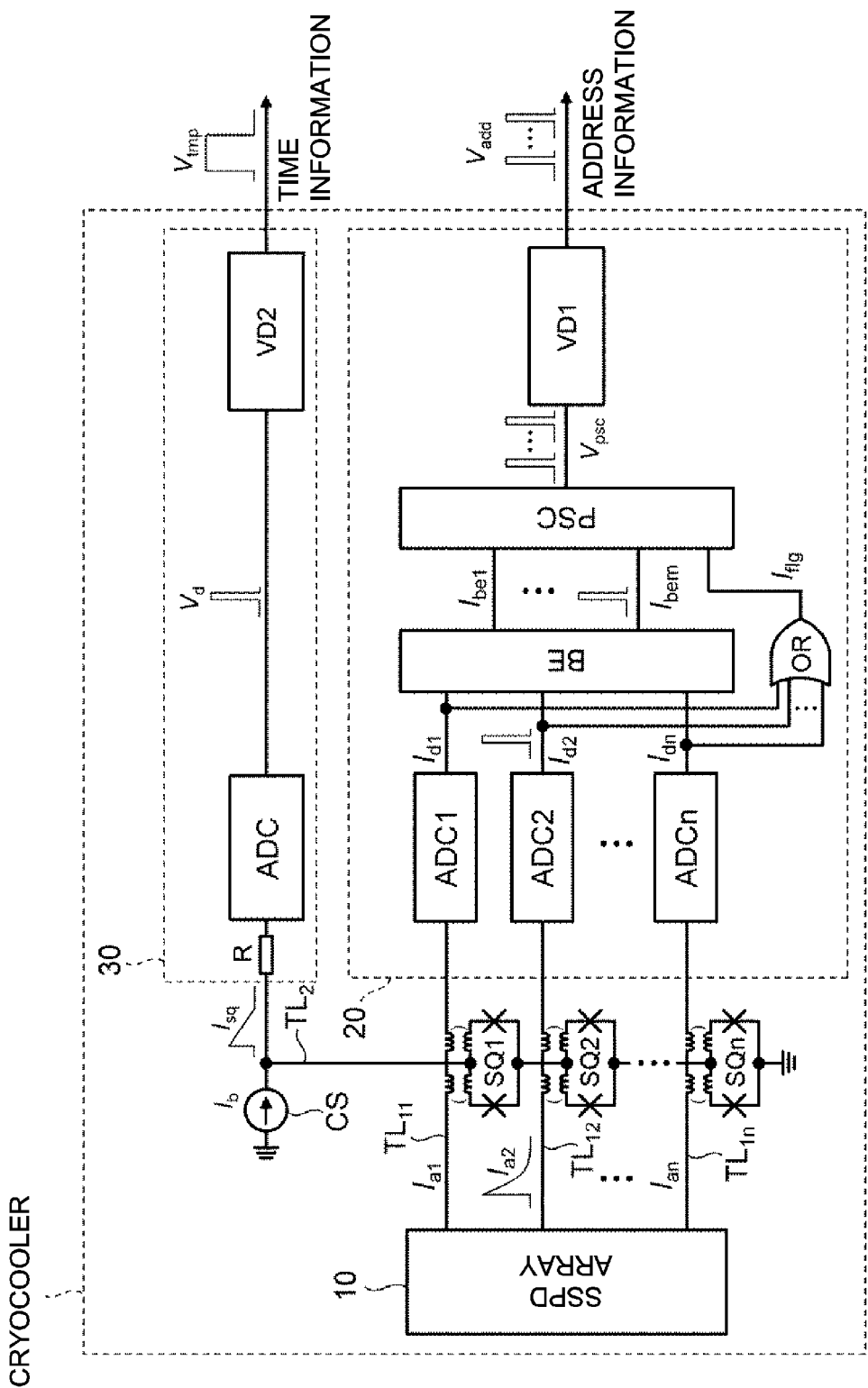
FIG. 2 is a block diagram showing a detailed configuration of the photon detection device according to the first embodiment.

A detailed configuration of the photon detection device according to the first embodiment will be described below with reference to FIG. 2. FIG. 2 is a block diagram showing the detailed configuration of the photon detection device according to the first embodiment shown in FIG. 1. In FIG. 2, n SSPD elements forming the SSPD array 10 are provided side by side in a row as a simple example, and are connected to n first transmission lines TL11 to TL1$n$ in a one-to-one manner.

The address information generation circuit 20, the second transmission line TL2, and the time information generation circuit 30 will be described in detail below. In the following description, a case of n=4 will be described.

Configuration of Address Information Generation Circuit 20

As shown in FIG. 2, the address information generation circuit 20 includes n analog-to-digital converters ADC1 to ADCn, an OR gate OR, a binary encoder BE, a parallel-to-serial converter PSC, and a voltage driver VD1.

Detailed circuit configurations of the analog-to-digital converters ADC1 to ADCn, the binary encoder BE, the parallel-to-serial converter PSC, and the voltage driver VD1 will be described in a second embodiment.

The n analog-to-digital converters ADC1 to ADCn are connected to n first transmission lines TL11 to TL1$n$ in a one-to-one manner. The analog-to-digital converters ADC1 to ADCn convert the analog detection currents Ia1 to Ian, which are input via the first transmission lines TL11 to TL1$n$, into digital current signals Id1 to Idn. FIG. 2 shows a state in which the analog detection current Ia2 is converted into the digital current signal Id2 by the analog-to-digital converter ADC2 and the digital current signal is output.

Output signals of the analog-to-digital converters ADC1 to ADCn are not limited to the digital current signals, and may be digital voltage signals.

The binary encoder BE encodes the digital current signals Id1 to Idn output from the analog-to-digital converters ADC1 to ADCn. An output terminal of the binary encoder BE is provided with m transmission lines, and digital current signals Ibe1 to Ibem are output from the transmission lines. Here, $m = \log_2 n$, and $m = 2$ when $n = 4$.

The output signals of the binary encoder BE are not limited to the digital current signals, and may be digital voltage signals.

Since the number of signals is reduced when the binary encoder BE is provided, the circuit scale of the parallel-to-serial converter PSC in the subsequent stage can be reduced. In addition, since a bit string of an address information signal Vadd, which is finally output after being converted into a serial signal by the parallel-to-serial converter PSC to be described below, becomes shorter, it is advantageous for a high-speed operation. Further, for example, when the parallel-to-serial converter PSC is not provided, the number of parallel signal lines taken out of the cryocooler can be reduced.

The OR gate OR generates a flag signal Iflg indicating that a photon has been detected in any of the SSPD elements. Therefore, all of the digital current signals Id1 to Idn to be output from the analog-to-digital converters ADC1 to ADCn are input to the OR gate OR. The flag signal Iflg is also a digital current signal.

The output signal of the OR gate OR is not limited to the digital current signal, and may be a digital voltage signal.

The parallel-to-serial converter PSC converts a parallel signal including the input m digital current signals Ibe1 to Ibem and the flag signal Iflg into a serial signal. Therefore, one transmission line is provided on the output terminal of the parallel-to-serial converter PSC, and a digital voltage signal Vpsc is output from such a transmission line.

The output signal of the parallel-to-serial converter PSC is not limited to the digital voltage signal, and may be a digital current signal.

The voltage driver VD1 amplifies the digital voltage signal Vpsc, and outputs the address information signal Vadd. The address information signal Vadd is an output signal of the address information generation circuit 20, and is extracted out of the cryocooler.

The address information signal may be used as a current signal. Further, a current driver may be provided instead of the voltage driver VD1.

Configuration of Second Transmission Line TL2

Before a detailed description of the time information generation circuit 30, details of the second transmission line TL2 will be described in detail.

As shown in FIG. 2, n direct-current SQUID elements SQ1 to SQn are connected in series to the second transmission line TL2. The SQUID elements SQ1 to SQn are one aspect of the magnetic coupling elements MC1 to MCn shown in FIG. 1. One end of the SQUID element SQ1 is connected to the time information generation circuit 30 together with a current source CS. The other end of the SQUID element SQ1 is connected to one end of the SQUID element SQ2. Similarly, other SQUID elements are also connected to each other, and one end of the last SQUID element SQn is grounded.

As shown in FIG. 2, each of the SQUID elements SQ1 to SQn is provided with inductors between a pair of Josephson junctions. The inductors provided in each of the SQUID elements SQ1 to SQn and the inductors provided in each of the first transmission lines TL11 to TL1n are arranged to face each other and are magnetically coupled to each other. In other words, the second transmission line TL2 is magnetically coupled to all of the n first transmission lines TL11 to TL1n via the SQUID elements SQ1 to SQn.

Here, a bias current Ib is supplied from the current source CS to the SQUID elements SQ1 to SQn. Normally, since the SQUID elements SQ1 to SQn are in a superconducting state, the entire amount of the bias current Ib supplied from the current source CS flows through the SQUID elements SQ1 to SQn, and does not flow through the time information generation circuit 30 provided with a resistor element R.

On the other hand, as shown in FIG. 2, when the pulsed analog detection current Ia2 is output from the SSPD element connected to the first transmission line TL12, a potential difference transiently occurs in the SQUID element SQ2 magnetically coupled to the first transmission line TL12. Accordingly, since the bias current Ib transiently flows through the time information generation circuit 30, an analog current signal Isq is generated.

In this way, the n SQUID elements SQ1 to SQn connected in series to the second transmission line TL2 has a function as a parallel-to-serial converter that converts the parallel signal including the input n analog detection currents Ia1 to Ian into a serial signal (analog current signal Isq).

Configuration of Time Information Generation Circuit 30

The time information generation circuit 30 includes a resistor element R, an analog-to-digital converter ADC, and a voltage driver VD2 as shown in FIG. 2.

Detailed circuit configurations of the analog-to-digital converter ADC and the voltage driver VD2 will be described in a second embodiment.

The analog-to-digital converter ADC converts the analog current signal Isq into a digital voltage signal Vd.

The output signal of the analog-to-digital converter ADC is not limited to the digital voltage signal, and may be a digital current signal.

Similarly to the voltage driver VD1, the voltage driver VD2 amplifies the digital voltage signal Vd, and outputs a time information signal Vtmp. The time information signal Vtmp is an output signal of the time information generation circuit 30, and is extracted out of the cryocooler.

The time information signal may be used as a current signal. Further, a current driver may be provided instead of the voltage driver VD2.

Operation of Photon Detection Device

Figure 3:
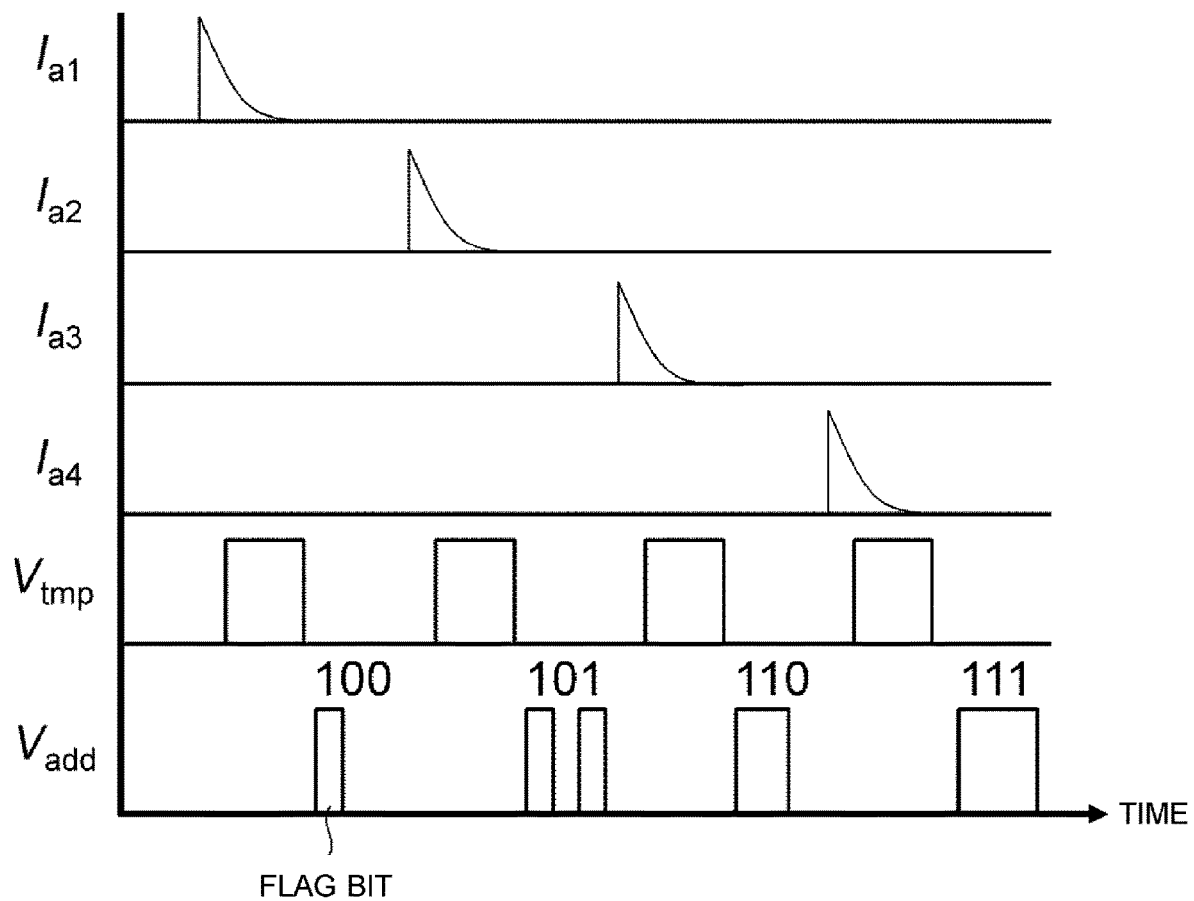
FIG. 3 is a timing chart for illustrating an operation of the photon detection device according to the first embodiment.

An operation of the photon detection device according to the first embodiment will be described below with reference to FIG. 3. FIG. 3 is a timing chart for explaining the operation of the photon detection device according to the first embodiment. As described above, the case of $n = 4$ is shown.

Here, an address "00" is assigned to the SSPD element connected to the first transmission line TL11, an address "01" is assigned to the SSPD element connected to the first transmission line TL12, an address "10" is assigned to the SSPD element connected to the first transmission line TL13, and an address "11" is assigned to the SSPD element connected to the first transmission line TL14.

As shown in the uppermost graph in FIG. 3, when the analog detection current Ia1 is output from the SSPD element connected to the first transmission line TL11, the time information signal Vtmp and the address information signal Vadd are output which are shown in a second graph from the bottom and the lowermost graph in FIG. 3, respectively. In this case, a signal "100" is output as the address information signal Vadd. Here, since the leading "1" is a flag bit based on the flag signal Iflg described above, it indicates that the address is "00".

Similarly, as shown in a second graph from the top in FIG. 3, when the analog detection current Ia2 is output from the SSPD element connected to the first transmission line TL12, the time information signal Vtmp and the address information signal Vadd are output. In this case, a signal "101" indicating that the address is "01" is output as the address information signal Vadd.

Similarly, as shown in a third graph from the top in FIG. 3, when the analog detection current Ia3 is output from the SSPD element connected to the first transmission line TL13, the time information signal Vtmp and the address information signal Vadd are output. In this case, a signal "110" indicating that the address is "10" is output as the address information signal Vadd.

Similarly, as shown in a fourth graph from the top in FIG. 3, when the analog detection current Ia4 is output from the SSPD element connected to the first transmission line TL14, the time information signal Vtmp and the address information signal Vadd are output. In this case, a signal "111" indicating that the address is "11" is output as the address information signal Vadd.

Description of Effects

As described above, in Patent Literature 2, the transmission lines connected to the superconducting photon detectors are branched into two parts. Therefore, the number of transmission lines identical to the number of the transmission lines to be input to the address information generation circuit is also input to the time information generation circuit. Accordingly, there are problems that the circuit scale of the time information generation circuit is large and the power consumption is also high.

On the other hand, in the photon detection device according to the present embodiment, one second transmission line TL2 is magnetically coupled to all of the n first transmission lines TL11 to TL1n via the magnetic coupling elements MC1 to MCn. In other words, the transmission line connected to the superconducting photon detectors (SSPD elements) is not branched into two parts.

Therefore, only one second transmission line TL2 is input to the time information generation circuit 30. Accordingly, the analog-to-digital converter included in the time information generation circuit 30 is only one analog-to-digital converter ADC. As a result, the circuit scale of the time information generation circuit 30 and the power consumption can be significantly reduced as compared with Patent Literature 2.

Second Embodiment

Detailed Configuration of Photon Detection Device

Figure 4:
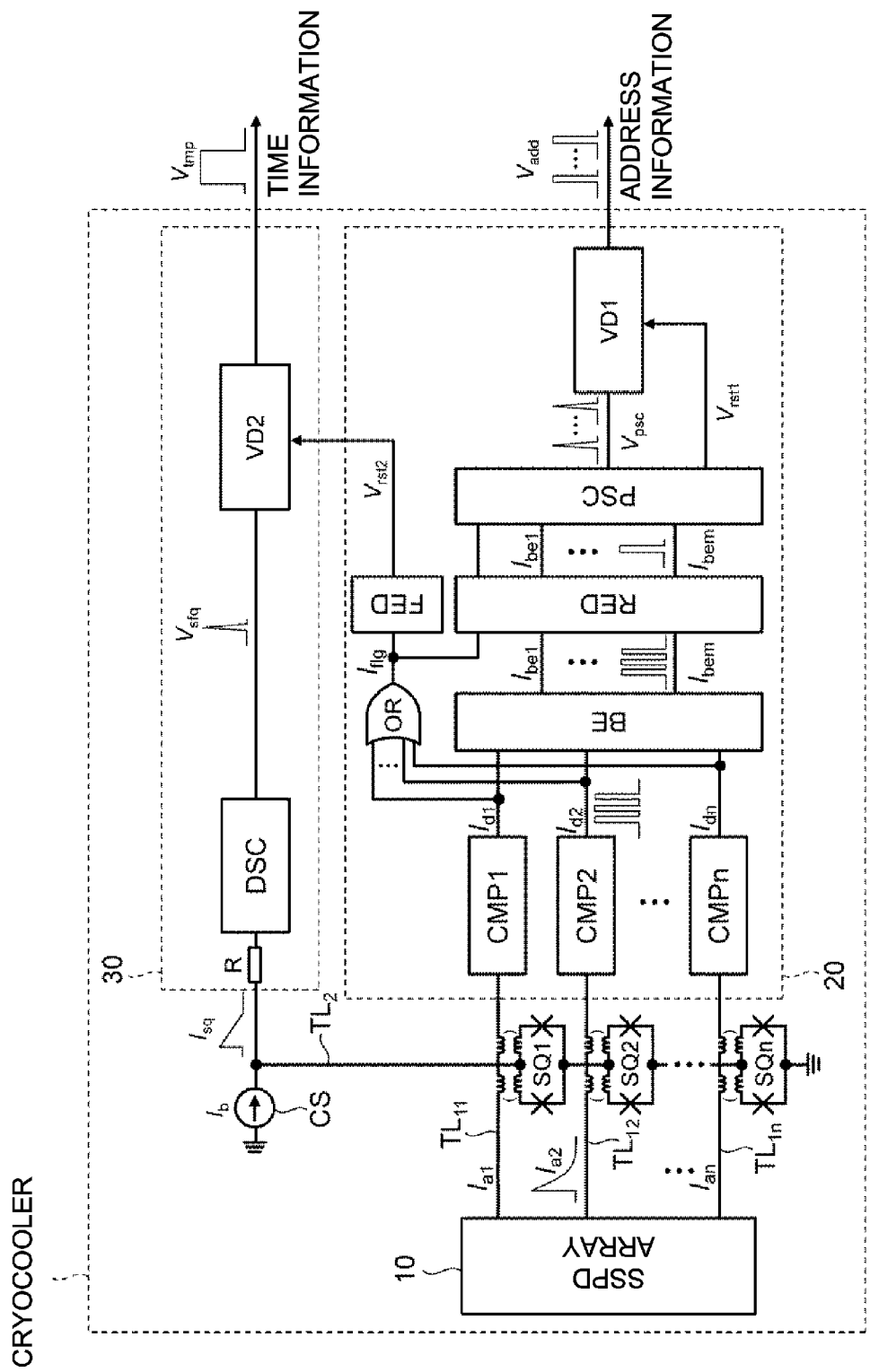
FIG. 4 is a block diagram showing a detailed configuration of a photon detection device according to a second embodiment.

A configuration of a photon detection device according to a second embodiment will be described below with reference to FIG. 4. FIG. 4 is a block diagram showing a detailed configuration of the photon detection device according to the second embodiment. As shown in FIG. 4, in the photon detection device according to the second embodiment, an address information generation circuit 20 of the photon detection device includes comparators CMP1 to CMPn and a rising edge detection circuit RED instead of the analog-to-digital converters ADC1 to ADCn shown in FIG. 2. In the photon detection device according to the second embodiment, the address information generation circuit 20 further includes a falling edge detection circuit FED. In addition, the time information generation circuit 30 includes a DC-to-SFQ converter DSC instead of the analog-to-digital converter ADC shown in FIG. 2.

Detailed Configuration of Address Information Generation Circuit 20

A description will be given below with respect to detailed configurations of the comparators CMP1 to CMPn, the binary encoder BE, the rising edge detection circuit RED, the parallel-to-serial converter PSC, and the voltage driver VD1 included in the address information generation circuit 20.

Each of n comparators CMP1 to CMPn is connected to each of n first transmission lines TL11 to TL1n in a one-to-one manner. For example, the comparator CMP1 converts an analog detection current Ia1 input via the first transmission line TL11 into a digital current signal Id1. The same applies to the other comparators CMP2 to CMPn. FIG. 4 shows a state in which an analog detection current Ia2 is converted into a digital current signal Id2 by the comparator CMP2 and the digital current signal is output. As described above, each of the comparators CMP1 to CMPn is one aspect of the analog-to-digital converter.

Figure 5:
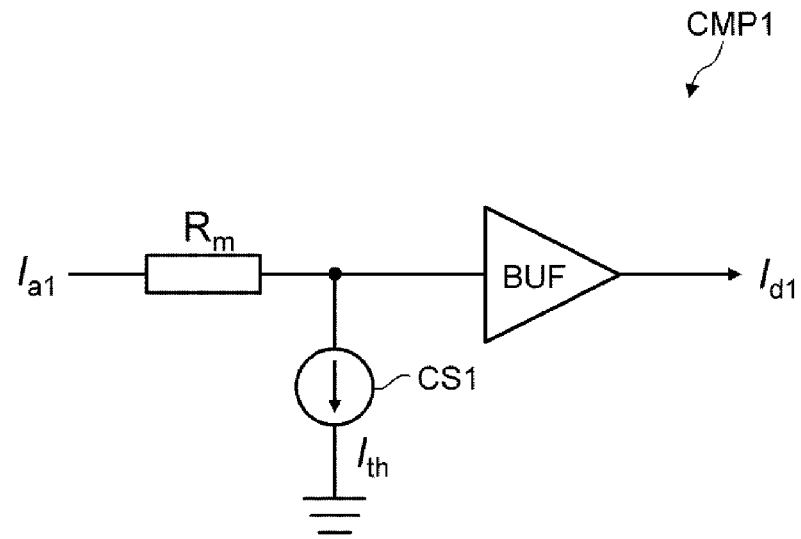
FIG. 5 is a circuit diagram showing a configuration of CMP1.
Figure 6:
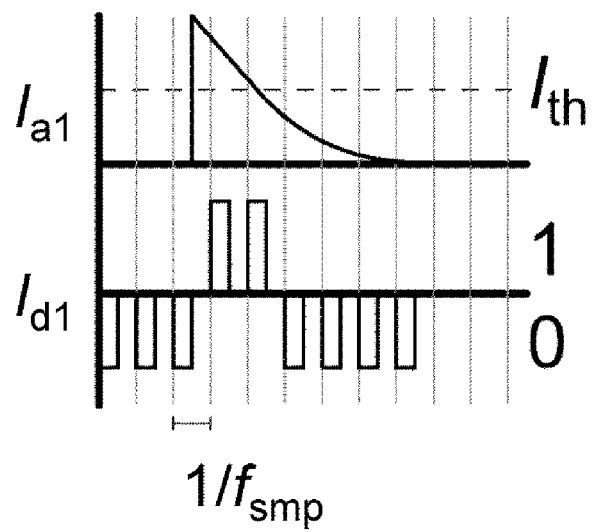
FIG. 6 is a timing chart showing an operation of the CMP1.

Detailed configurations and operations of the comparators CMP1 to CMPn will be described herein with reference to FIGS. 5 and 6. FIG. 5 is a circuit diagram showing a configuration of the comparator CMP1. FIG. 6 is a timing chart showing an operation of the CMP1. A configuration and an operation of the other comparators CMP2 to CMPn are the same as those of the comparator CMP1.

As shown in FIG. 5, the comparator CMP1 includes a matching resistor Rm, a current source CS1, and a buffer circuit BUF.

The analog detection current Ia1 is input from one end of the matching resistor Rm. The other end of the matching resistor Rm is connected to an input port of the buffer circuit BUF. The digital current signal Id1 is output from an output port of the buffer circuit BUF. The current source CS1 is connected to the input port of the buffer circuit BUF to generate a DC threshold current Ith.

As shown in FIG. 6, the buffer circuit BUF performs sampling of the analog detection current Ia1 in synchronization with an AC excitation current (bias current) Ix shown in FIG. 7, which will be described in detail below. Therefore, a frequency of the AC excitation current Ix represents a sampling frequency fsmp, and a sampling period represents a reciprocal number (1/fsmp) thereof. As shown in FIG. 6, when the analog detection current Ia1 is larger than the threshold current Ith, "1" is output, and when the analog detection current Ia1 is smaller than the threshold current Ith, "0" is output. In this way, the buffer circuit BUF outputs an RZ-type digital current signal in synchronization of the AC threshold current Ith.

Here, the buffer circuit BUF according to the present embodiment is formed by an AC-driven superconducting logic circuit. An example of the AC-driven superconducting logic circuit may include a QFP circuit represented by an adiabatic QFP (AQFP: Adiabatic Quantum-Flux-Parametron) circuit or an RQL (Reciprocal Quantum Logic) circuit. The AC-driven superconducting logic circuit is superior to a DC-driven superconducting logic circuit such as SFQ circuit in that power consumption is low.

Figure 7:
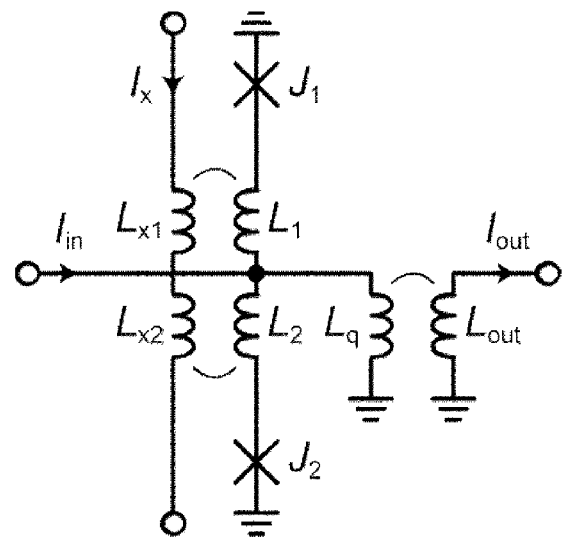
FIG. 7 is a view showing an example of an AC-driven superconducting logic circuit forming a buffer circuit BUF.

Here, FIG. 7 shows an example of the AC-driven superconducting logic circuit forming the buffer circuit BUF. An AQFP circuit shown in FIG. 7 includes inductors L1, L2, and Lq, an output inductor Lout, Josephson junctions J1 and J2, and excitation inductors Lx1 and Lx2. The AQFP circuit includes a superconducting loop formed by the Josephson junction J1 and the inductors L1 and Lq and a superconducting loop formed by the Josephson junction J2 and the inductors L2 and Lq. An AC excitation current Ix flows through the excitation inductors Lx1 and Lx2, an excitation flux is applied to the two superconducting loops via the inductors L1 and L2 magnetically coupled to the excitation inductors Lx1 and Lx2.

For example, a case where the Josephson junction J2 is switched is defined as "0", and a case where the Josephson junction J1 is switched is defined as "1". In the case of logic "0", a negative current flows through the inductor Lq, and in the case of logic "1", a positive current flows through the inductor Lq. Then, according to the current flowing through the inductor Lq, an output current Iout also flows through the inductor Lout magnetically coupled to the inductor Lq and is output.

Figure 8:
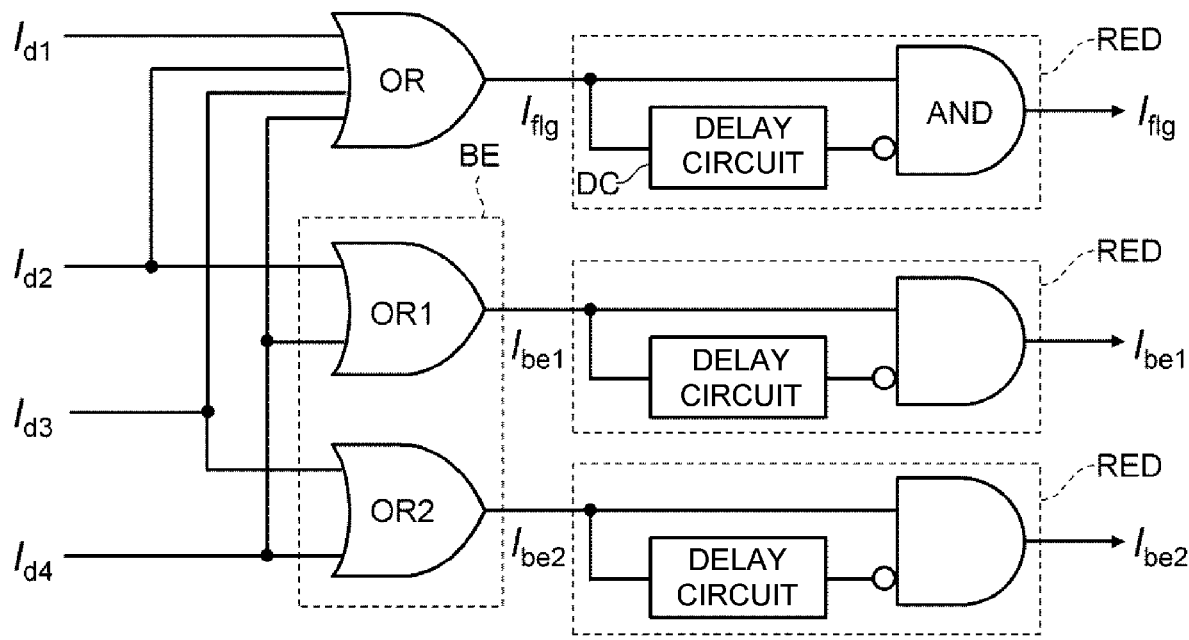
FIG. 8 is a circuit diagram showing a configuration of a binary encoder BE and a rising edge detection circuit RED.
Figure 9:
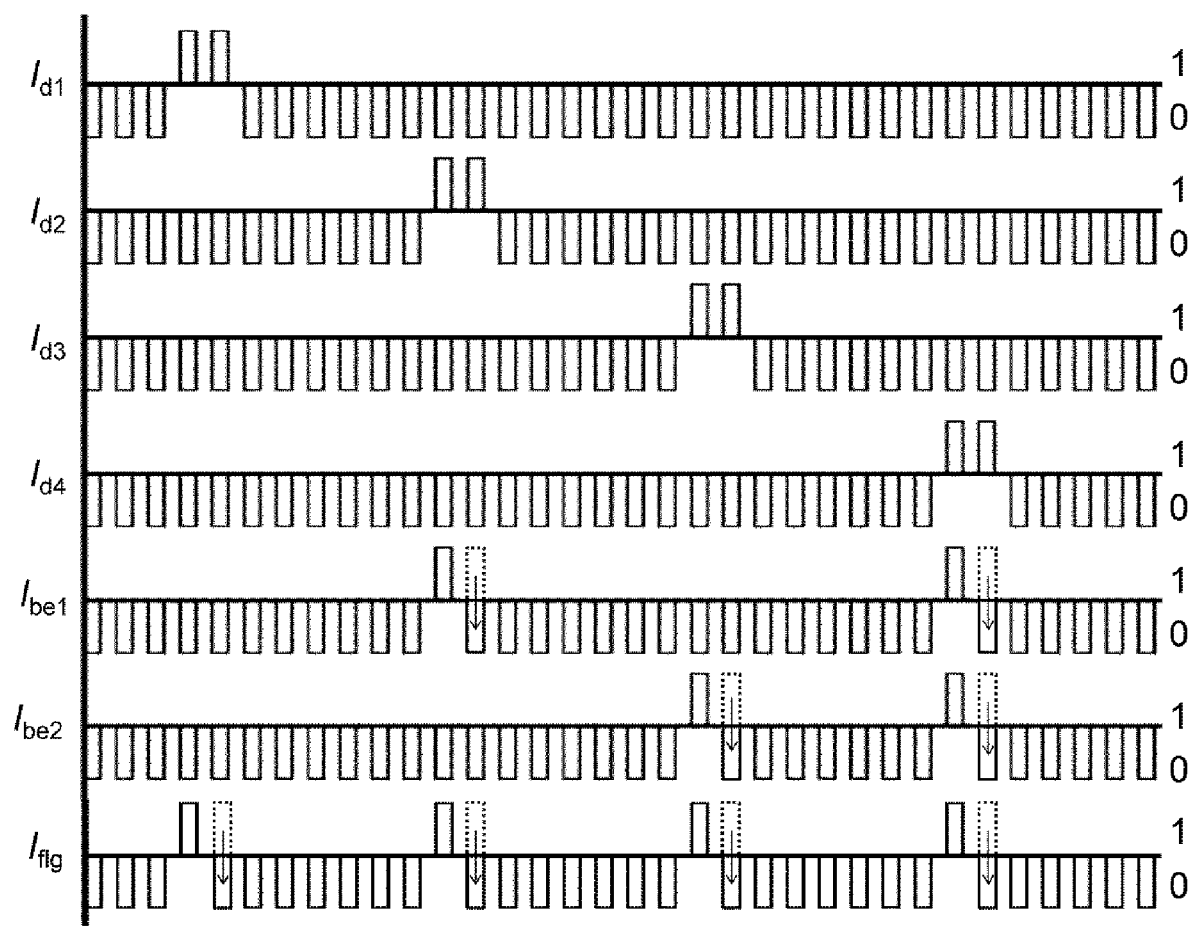
FIG. 9 is a timing chart showing an operation of the binary encoder BE and the rising edge detection circuit RED.

A configuration and an operation of the binary encoder BE and the rising edge detection circuit RED will be described below with reference to FIGS. 8 and 9. FIG. 8 is a circuit diagram showing a configuration of the binary encoder BE and the rising edge detection circuit RED. FIG. 9 is a timing chart showing an operation of the binary encoder BE and the rising edge detection circuit RED. FIGS. 8 and 9 show a case of n=4, and FIG. 8 also shows an OR gate OR that generates a flag signal Iflg.

Similarly to the comparators CMP1 to CMPn, all of the binary encoder BE, the rising edge detection circuit RED, and the OR gate OR are formed by an AC-driven superconducting logic circuit such as an AQFP circuit. With such a configuration, it is possible to reduce the power consumption of the address information generation circuit 20.

Because of n=4, the binary encoder BE is formed by two OR gates OR1 and OR2. Digital current signals Id2 and Id4 are input to the OR gate OR1, and a digital current signal Ibe1 is output. Digital current signals Id3 and Id4 are input to the OR gate OR2, and a digital current signal Ibe2 is output.

Therefore, a value of the digital current signal Ibe1 shown in a third graph from the bottom in FIG. 9 is "1" at timing when the value of the digital current signal Id2 or Id4 shown in the second or fourth graph from the top in FIG. 9 is "1". In addition, a value of the digital current signal Ibe2 shown in a second graph from the bottom in FIG. 9 is "1" at timing when the value of the digital current signal Id3 or Id4 shown in the third or fourth graph from the top in FIG. 9 is "1". In FIG. 9, the values of the digital current signals Ibe1 and Ibe2 output from the binary encoder BE are partially drawn by broken lines.

The OR gate OR generates a flag signal Iflg indicating that a photon has been detected in any of the SSPD elements, as described with reference to FIG. 2. Therefore, as shown in FIG. 8, all of the digital current signals Id1 to Id4 are input to the OR gate OR, and the flag signal Iflg is output. Therefore, a value of the flag signal Iflg shown in the lowermost graph in FIG. 9 is "1" at timing when the value of any of the digital current signals Id1 to Id4 shown in first to fourth graphs from the top in FIG. 9 is "1". In FIG. 9, the value of the flag signal Iflg output from the OR gate OR is partially drawn by a broken line.

As shown in FIG. 8, the digital current signals Ibe1 and Ibe2 and the flag signal Iflg pass through the rising edge detection circuits RED. The edge detection circuits RED have the same circuit configuration. The rising edge detection circuit RED includes an AND gate AND and a delay circuit DC. The delay circuit DC delays the input signal by one cycle. The input signal and an inversion signal of the output signal of the delay circuit DC are input to the AND gate AND.

In FIG. 9, the digital current signals Ibe1 and Ibe2 and the flag signal Iflg, which have passed through the rising edge detection circuit RED, are shown by solid lines. As indicated by arrows in FIG. 9, when the signals pass through the rising edge detection circuit RED, only one cycle located at the rising edge is maintained at "1", and values after a second cycle are switched from "1" to "0".

Here, the analog-to-digital converters ADC1 to ADCn shown in FIG. 2 according to the first embodiment have, for example, a circuit configuration in which the rising edge detection circuits RED shown in FIG. 8 are connected to subsequent stages of the comparators CMP1 to CMPn shown in FIG. 5. In the photon detection device according to the second embodiment, as shown in FIGS. 4 and 8, the rising edge detection circuit RED is arranged in the subsequent stage of the binary encoder BE. Therefore, the number of rising edge detection circuits RED can be reduced and the circuit scale can be reduced as compared with the photon detection device according to the first embodiment.

The rising edge detection circuit RED may not be provided.

Figure 10:
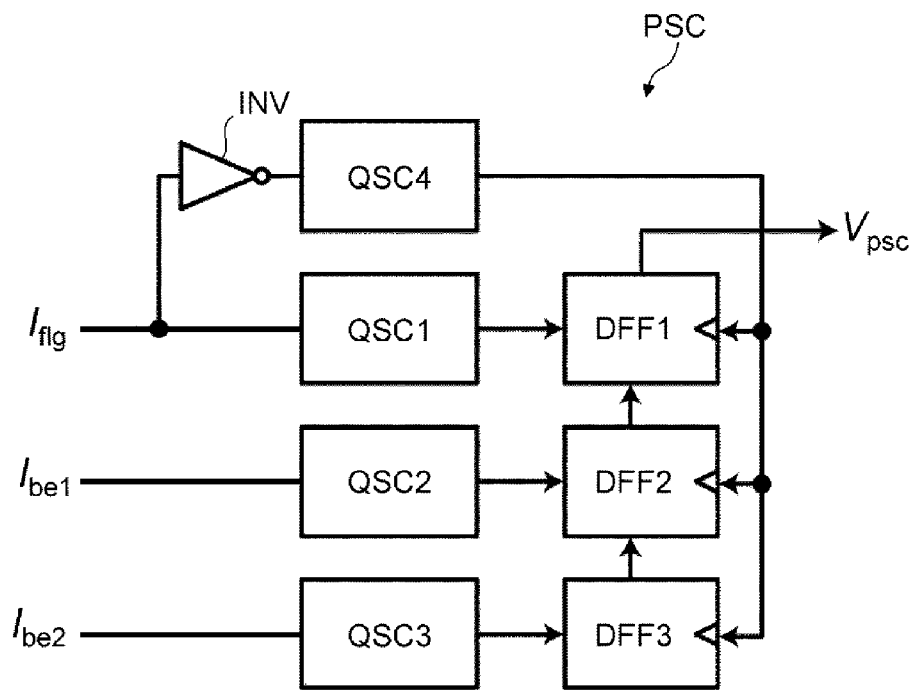
FIG. 10 is a circuit diagram showing a configuration of a parallel-to-serial converter PSC.
Figure 11:
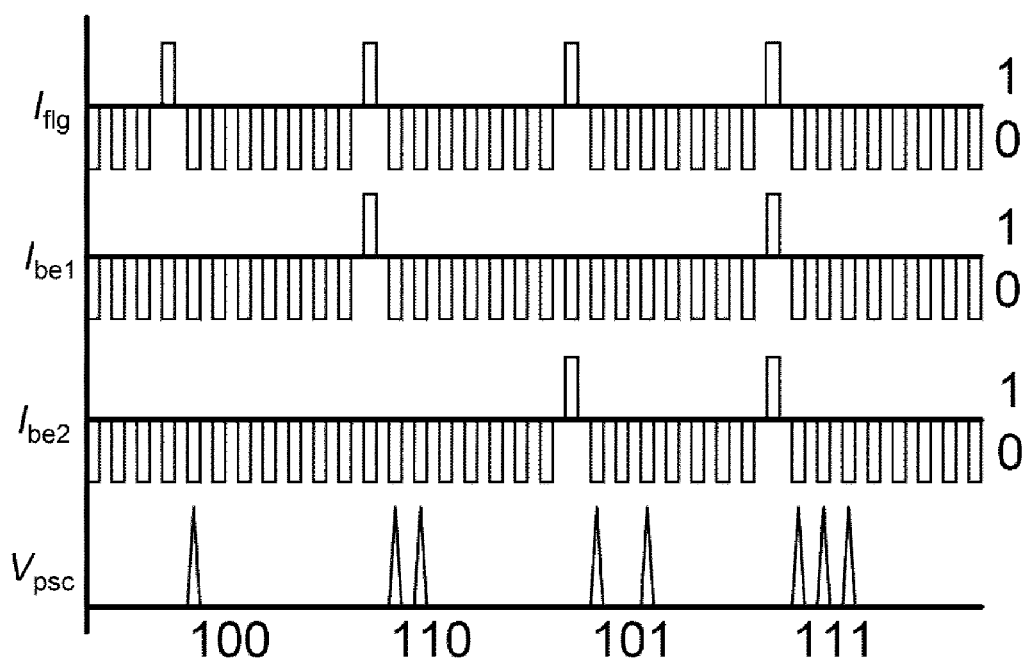
FIG. 11 is a timing chart showing an operation of the parallel-to-serial converter PSC.

A configuration and an operation of the parallel-to-serial converter PSC will be described below with reference to FIGS. 10 and 11. FIG. 10 is a circuit diagram showing a configuration of the parallel-to-serial converter PSC. FIG. 11 is a timing chart showing an operation of the parallel-to-serial converter PSC. FIGS. 10 and 11 show a case of n=4. As shown in FIG. 10, the parallel-to-serial converter PSC includes four QFP-to-SFQ converters QSC1 to QSC4, three D flip-flops DFF1 to DFF3, and an inverter INV.

Each of the QFP-to-SFQ converters QSC1 to QSC3 converts the digital current signals Ibe1 and Ibe2 and the flag signal Iflg caused by the QFP circuit into digital voltage signals which are SFQ pulse signals. The QFP-to-SFQ converter QSC4 converts an inversion signal of the flag signal Iflg input via the inverter INV into a digital voltage signal which is an SFQ pulse signal.

Here, the inverter INV and input sides of the QFP-to-SFQ converters QSC1 to QSC4 are formed by a QFP circuit which is an AC-driven superconducting logic circuit, and are formed by an AQFP circuit in the present embodiment. On the other hand, output sides of the QFP-to-SFQ converters QSC1 to QSC4 are formed by an SFQ circuit which is a DC-driven superconducting logic circuit, and are formed by an RSFQ circuit in the present embodiment.

The D flip-flops DFF1 to DFF3 form a shift register for parallel/serial conversion. As shown in FIG. 10, each of the flag signal Iflg and the digital current signals Ibe1 and Ibe2 is converted into a digital voltage signal by the QFP-to-SFQ converters QSC1 to QSC3, and is input to the D flip-flops DFF1 to DFF3 as data. An inversion signal of the flag signal Iflg is converted into a digital voltage signal by the QFP-to-SFQ converter QSC4, and is input to the D flip-flops DFF1 to DFF3 as a clock. The D flip-flops DFF1 to DFF3 are formed by an SFQ circuit which is a DC-driven superconducting logic circuit, and are formed by an RSFQ circuit in the present embodiment.

Then, the data input to the D flip-flops DFF1 to DFF3 are output as digital voltage signals Vpsc in that order. Therefore, as shown in FIG. 11, for example, when a value of the flag signal Iflg is "1", a value of the digital current signal Ibe1 is "0", and a value of the digital current signal Ibe2 is "0", "100" is output as the digital voltage signal Vpsc. As shown in FIG. 11, the same applies to other cases.

The parallel-to-serial converter PSC can also be formed by only the QFP circuit. In this case, the QFP-to-SFQ converters QSC1 to QSC4 are unnecessary.

Figure 12:
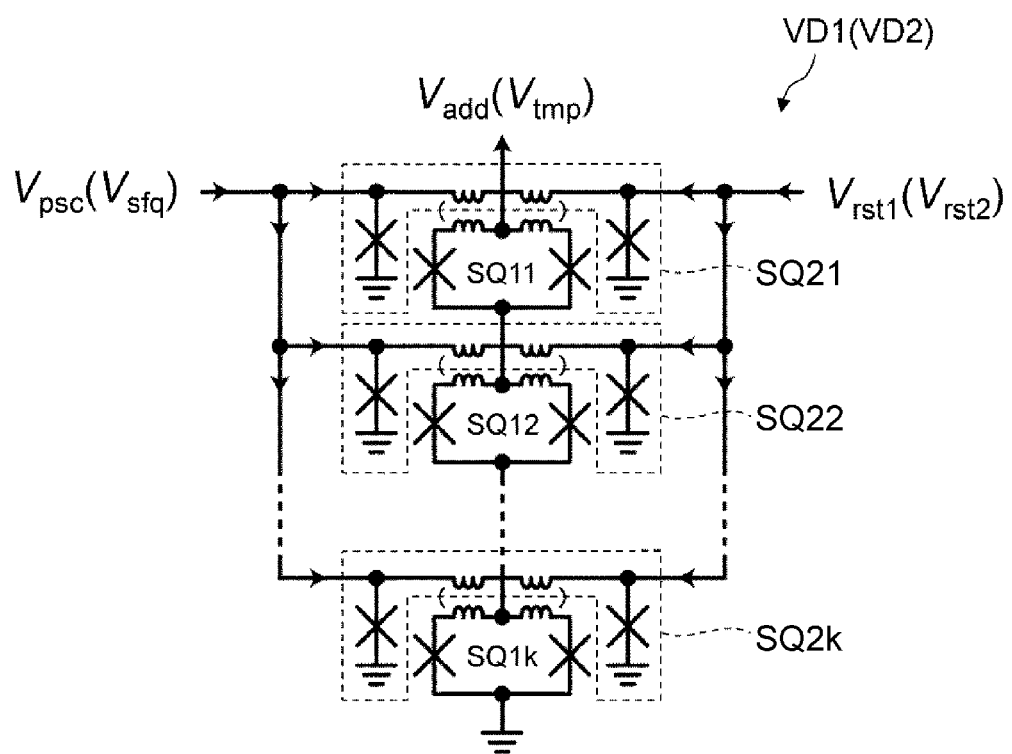
FIG. 12 is a circuit diagram showing a configuration of a voltage driver VD1.
Figure 13:
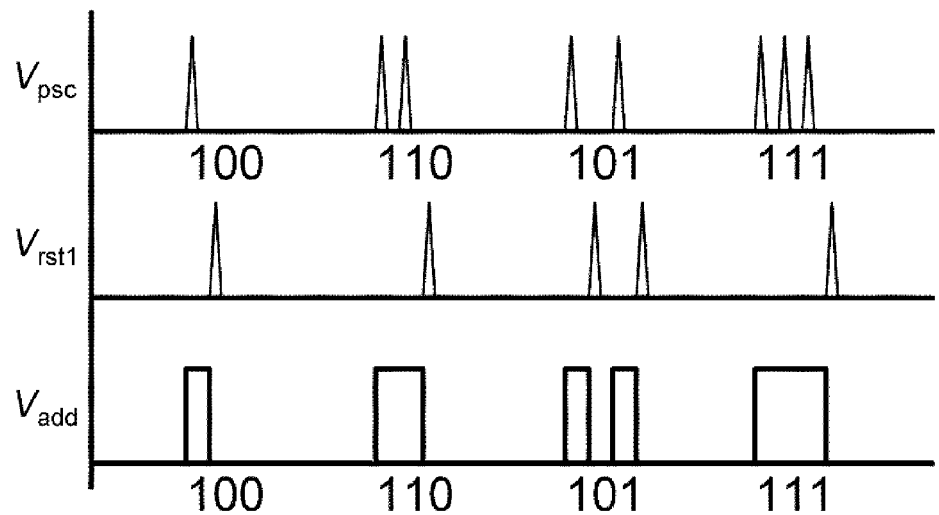
FIG. 13 is a timing chart showing an operation of the voltage driver VD1.

A configuration and an operation of the voltage driver VD1 will be described below with reference to FIGS. 12 and 13. FIG. 12 is a circuit diagram showing a configuration of the voltage driver VD1. FIG. 13 is a timing chart showing an operation of the voltage driver VD1. As shown in FIG. 12, the voltage drivers VD1 and VD2 have the same configuration, and input/output signals in the case of the voltage driver VD2 are also shown in parentheses. However, the voltage driver VD1 will be described herein.

As shown in FIG. 12, the voltage driver VD1 includes k (k being a natural number) pair of direct-current SQUID elements SQ11, SQ21 to SQ1k, and SQ2k. In other words, the voltage drivers VD1 and VD2 are formed by an SFQ circuit which is a DC-driven superconducting logic circuit. Both of the SQUID elements SQ11 and SQ21 include inductors between a pair of Josephson junctions, and are magnetically coupled to each other. The same applies to the other SQUID elements SQ12 and SQ22.

As shown in FIG. 12, k SQUID elements SQ11 to SQ1k are connected in series to each other. An address information signal Vadd is output from one end of the SQUID element SQ11, and the other end of the SQUID element SQ11 is connected to one end of the SQUID element SQ12. Similarly, other SQUID elements are also connected to each other, and one end of the last SQUID element SQ1k is grounded.

On the other hand, one end of each of k SQUID elements SQ21 to SQ2k is grounded, and the other end thereof is magnetically coupled to one of the k SQUID elements SQ11 to SQ1k. In the SQUID elements SQ21 to SQ2k, a digital voltage signal Vpsc is input to a node between one Josephson junction and the inductors, and a reset signal Vrst1 is input to a node between the other Josephson junction and the inductors.

Once a value of the digital voltage signal Vpsc becomes "1", a magnetic flux is held in the SQUID element SQ21 even after the value of the digital voltage signal Vpsc is switched to "0". Therefore, a value of the address information signal Vadd converted into a voltage by the SQUID element SQ11 magnetically coupled to the SQUID element SQ21 is held at "1". Here, when a value of the reset signal Vrst1 becomes "1", the magnetic flux held in the SQUID element SQ21 is canceled by a magnetic flux in a reverse direction. Therefore, the value of the address information signal Vadd is switched to "0".

The same applies to the other SQUID elements SQ12 and SQ22 and the SQUID elements SQ1k and SQ2k. Here, as the value of k is made larger and the number of pairs of SQUID elements increases, the address information signal Vadd can be amplified.

FIG. 13 shows the digital voltage signal Vpsc which is an input signal of the voltage driver VD1, the reset signal Vrst1, and the address information signal Vadd which is an output signal. Here, the reset signal Vrst1 can be generated from an inversion signal of the digital voltage signal Vpsc. The voltage driver VD1 can also be formed by only a QFP circuit. Further, as a matter of course, each of the signals shown in FIG. 13 is an example, and various patterns may exist.

Detailed Configuration of Time Information Generation Circuit 30

A description will be given below with respect to detailed configurations of the DC-to-SFQ converter DSC and the voltage driver VD2 included in the time information generation circuit 30. Here, the voltage driver VD2 has the same configuration as the voltage driver VD1 described above.

The DC-to-SFQ converter DSC shown in FIG. 4 is an aspect of the analog-to-digital converter ADC shown in FIG. 2. The DC-to-SFQ converter DSC is an SFQ circuit that converts the analog current signal Isq into a digital voltage signal Vsfq which is an SFQ pulse signal.

The digital voltage signal Vsfq, which is an SFQ pulse signal, may be a continuous pulse signal, but in such a case, only the leading pulse signal is used, so that the signal is schematically drawn as one pulse signal in FIG. 4.

The time information generation circuit 30 according to the present embodiment, that is, the DC-to-SFQ converter DSC and the voltage driver VD2 is formed by an SFQ circuit that is a DC-driven superconducting logic circuit. The DC-driven superconducting logic circuit is suitable for the time information generation circuit 30 in terms of being excellent in time resolution compared with the AC-driven superconducting logic circuit such as the QFP circuit. An example of the DC-driven SFQ circuit may include a rapid SFQ (RSFQ. Rapid Single Flux Quantum) circuit and an energy-efficient RSFQ circuit having lower power consumption.

Figure 14:
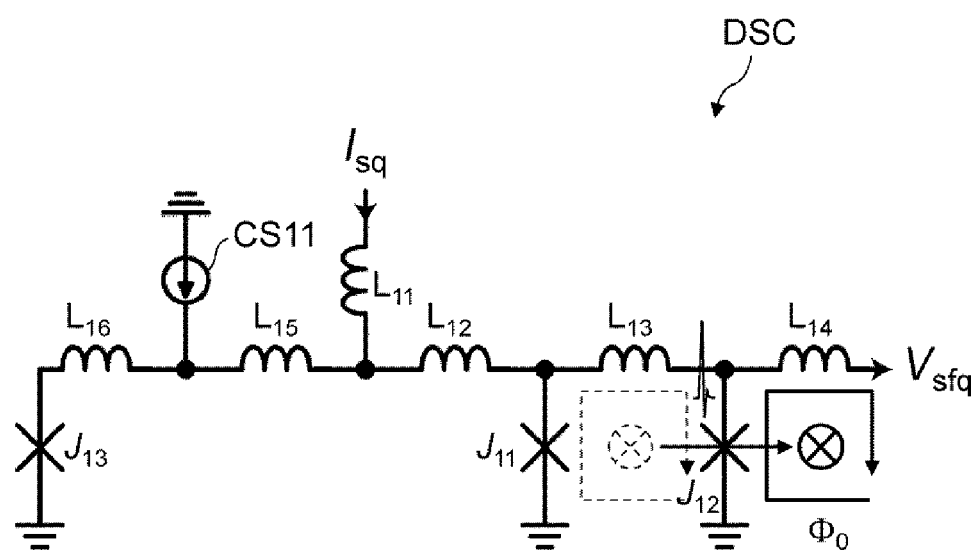
FIG. 14 is a circuit diagram showing a configuration of a DC-to-SFQ converter DSC.
Figure 15:
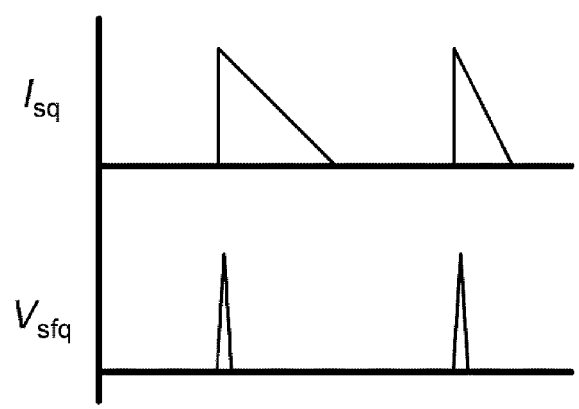
FIG. 15 is a timing chart showing an operation of the DC-to-SFQ converter DSC.

First, a configuration and an operation of the DC-to-SFQ converter DSC will be described with reference to FIGS. 14 and 15. FIG. 14 is a circuit diagram showing a configuration of the DC-to-SFQ converter DSC. FIG. 15 is a timing chart showing an operation of the DC-to-SFQ converter DSC.

As shown in FIG. 14, the DC-to-SFQ converter DSC is an RSFQ circuit including six inductors L11 to L16, three Josephson junctions J11 to J13, and a current source CS11.

An analog current signal Isq is input from one end of the inductor L11 of the inductors L11 to L14 connected in series to each other. A bias current is supplied from the current source CS11 to a connection node between the other end of the inductor L11 and one end of the inductor L12 via the inductor L15.

The other end of the Josephson junction J11 with one end grounded is connected to a connection node between the other end of the inductor L12 and one end of the inductor L13. Similarly, the other end of the Josephson junction J12 with one end grounded is connected to a connection node between the other end of the inductor L13 and one end of the inductor L14. In other words, a superconducting loop is formed by the inductor L13 and the Josephson junctions J11 and J12.

When the analog current signal Isq is input, the Josephson junction J11 switches and a flux quantum (DO is held in the superconducting loop described above. Accordingly, as indicated by a broken line arrow in FIG. 14, a circulating current is generated. When the circulating current exceeds a critical current value, the Josephson junction J12 switches, and as shown in FIG. 14, the flux quantum (DO moves to a right side of the drawing via the Josephson junction J12. At this time, as shown in FIG. 14, a pulsed voltage signal is generated across the Josephson junction J12, and is output as a digital voltage signal Vsfq from the other end of the inductor L14.

One end of the inductor L16 is connected to a node between the inductor L15 and the current source CS11. The other end of the Josephson junction J13 with one end grounded is connected to the other end of the inductor L16.

FIG. 15 shows the analog current signal Isq, which is an input signal of the DC-to-SFQ converter DSC, and the digital voltage signal Vsfq which is an output signal. As shown in FIG. 15, a pulse voltage is generated as the digital voltage signal Vsfq in concurrence with the rising of the analog current signal Isq.

A configuration and an operation of the voltage driver VD2 will be described below with reference to FIG. 12 described above. As shown in FIG. 12, the voltage drivers VD1 and VD2 have the same configuration, and input/output signals in the case of the voltage driver VD2 are also shown in parentheses. The voltage driver VD2 will be described herein.

As shown in FIG. 12, in the SQUID elements SQ21 to SQ2k in the case of the voltage driver VD2, the digital voltage signal Vsfq is input to a node between one Josephson junction and the inductor, and the reset signal Vrst2 is input to a node between the other Josephson junction and the inductor. Then, the time information signal Vtmp is output from one end of the SQUID element SQ11.

Here, as shown in FIG. 4, the reset signal Vrst2 is generated from the flag signal Iflg that has passed through the falling edge detection circuit FED, for example.

The output signal of the falling edge detection circuit FED is a digital current signal caused by the QFP circuit. Therefore, a QFP-to-SFQ converter, which converts a signal into a digital voltage signal which is an SFQ pulse signal, is required to generate the reset signal Vrst2 to be input to the voltage driver VD2, but is not shown in FIG. 4.

Third Embodiment

Detailed Configuration of Photon Detection Device

Figure 16:
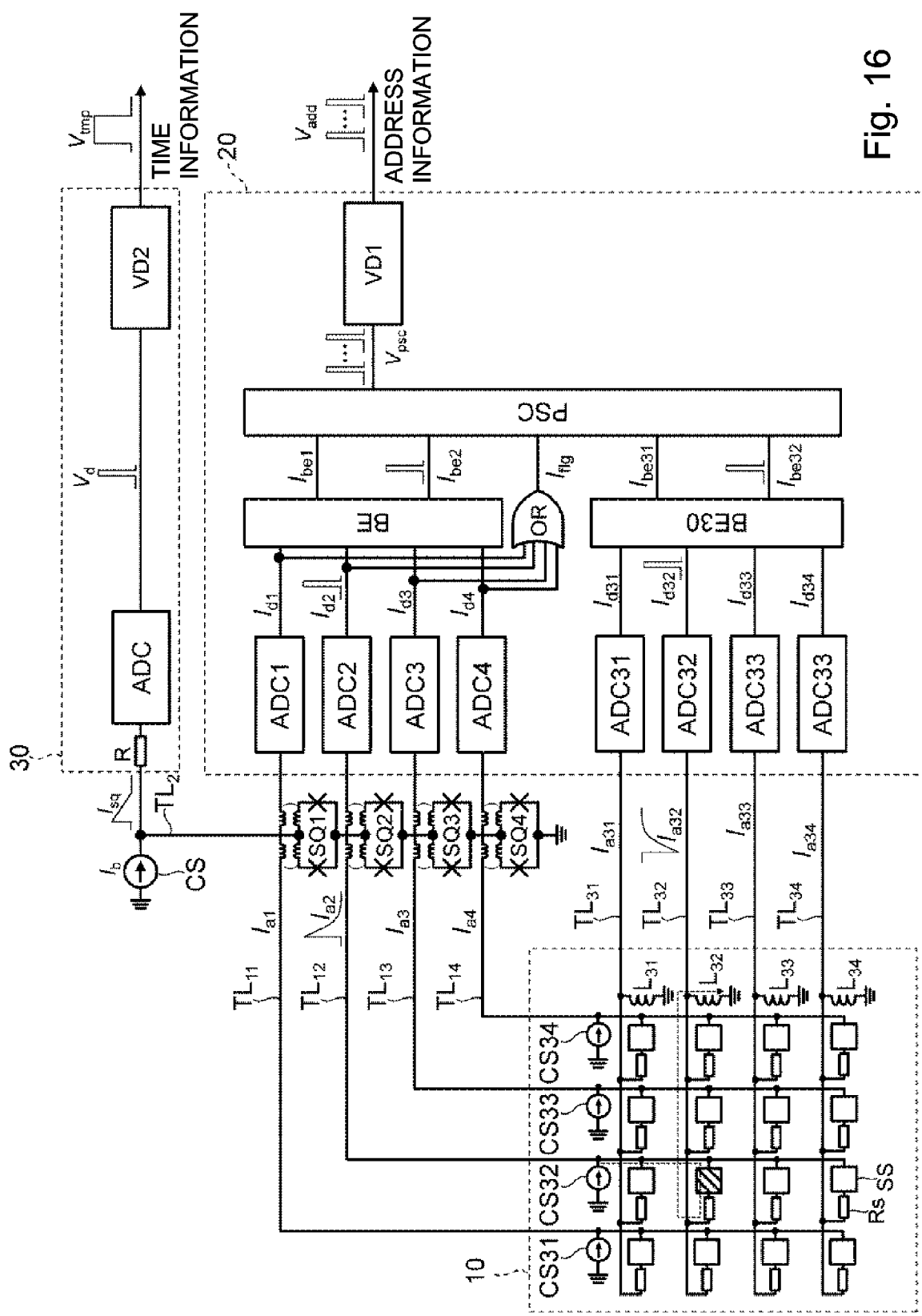
FIG. 16 is a block diagram showing a detailed configuration of a photon detection device according to a third embodiment.

A configuration of a photon detection device according to a third embodiment will be described below with reference to FIG. 16. FIG. 16 is a block diagram showing a detailed configuration of the photon detection device according to the third embodiment. As shown in FIG. 16, in the photon detection device according to the third embodiment, 16 SSPD elements SS are arranged with 4 rows×4 columns in a matrix in an SSPD array 10. In FIG. 16, the cryocooler shown in FIG. 2 is not shown.

As shown in FIG. 16, the photon detection device according to the third embodiment further includes third transmission lines TL31 to TL34 compared with the photon detection device according to the first embodiment shown in FIG. 2. In addition, an address information generation circuit 20 further includes four analog-to-digital converters ADC31 to ADC34 and a binary encoder BE30.

Here, FIG. 16 shows details of the SSPD array 10. The SSPD array 10 includes 16 SSPD elements SS, 16 resistor elements Rs, four current sources CS31 to CS34, and four inductors L31 to L34. As shown in FIG. 16, one end of each of the SSPD elements SS is connected to one of first transmission lines TL11 to TL14. Each of the other ends of the SSPD elements SS is connected to one of the third transmission lines TL31 to TL34 via each of the resistor elements Rs.

The other ends of the four current sources CS31 to CS34 with one end grounded are connected to the first transmission lines TL11 to TL14. For example, a bias current is supplied from the current source CS31 to the four SSPD elements SS connected to the first transmission line TL11.

The other ends of the four inductors L31 to L34 with one end grounded are connected to the third transmission lines TL31 to TL34.

In FIG. 16, the four first transmission lines TL11 to TL14 are provided corresponding to the columns of the SSPD elements SS. In other words, each of the first transmission lines TL11 to TL14 is commonly connected to the four SSPD elements SS arranged in a vertical direction of the drawing. For example, when a photon is incident on any of the four SSPD elements SS connected to the first transmission line TL12, an analog detection current Ia2 is output.

Further, in the photon detection device according to the third embodiment, the four third transmission lines TL31 to TL34 are provided corresponding to the rows of the SSPD elements. In other words, each of the third transmission lines TL31 to TL34 is commonly connected to the four SSPD elements arranged in a horizontal direction of the drawing. For example, when a photon is incident on any of the four SSPD elements connected to the third transmission line TL32, an analog detection current Ia32 is output.

Here, attention is paid to the SSPD element SS with diagonal lines.

Such an SSPD element SS is connected to the analog-to-digital converter ADC2 via the first transmission line TL12, and is connected to the analog-to-digital converter ADC32 via the third transmission line TL32 at the same time. Normally, a bias current supplied from the current source CS32 flows through the inductor L32 via the first transmission line TL12, the SSPD element SS, the resistor element Rs, and the third transmission line TL32 as indicated by a broken line arrow in FIG. 16. Here, each of the analog-to-digital converters ADC2 and ADC32 includes a matching resistor (not shown) at an input terminal thereof. Therefore, the bias current hardly flows through the analog-to-digital converter ADC2. Further, the bias current does not flow through the analog-to-digital converter ADC32, but flows through the inductor L32.

On the other hand, when a photon is incident on the SSPD element SS with the diagonal lines, a resistance is transiently generated in the SSPD element SS, and the bias current flows through the analog-to-digital converter ADC2 via the first transmission line TL12, so a positive analog detection current Ia2 is generated. At the same time, since the bias current flowing through the inductor L32 is reduced, a current flows from the analog-to-digital converter ADC32 to the inductor L32 via the third transmission line TL32, and a negative analog detection current Ia32 is generated.

As described above, when the photon is incident on a certain SSPD element SS, a positive analog detection current is generated in the first transmission line connected to such an SSPD element SS, and a negative analog detection current is generated in the third transmission line at the same time. Therefore, it is possible to specify an address of the SSPD element SS on which the photon is incident.

The four analog-to-digital converters ADC31 to ADC34 are connected to the four third transmission lines TL31 to TL34 in a one-to-one manner. The analog-to-digital converters ADC31 to ADC34 convert analog detection currents Ia31 to Ia34, which are input via the third transmission lines TL31 to TL34, into digital current signals Id31 to Id34. FIG. 16 shows a state in which the analog detection current Ia32 is converted into the digital current signal Id32 by the analog-to-digital converter ADC32 and the digital current signal is output.

The output signals of the analog-to-digital converters ADC31 to ADC34 are not limited to the digital current signals, and may be digital voltage signals.

The binary encoder BE30 encodes the digital current signals Id31 to Id34 output from the analog-to-digital converters ADC31 to ADC34. An output terminal of the binary encoder BE30 is provided with two transmission lines, and digital current signals Ibe31 and Ibe32 are output from the transmission lines.

The output signals of the binary encoder BE30 are not limited to the digital current signals, and may be digital voltage signals.

The parallel-to-serial converter PSC converts a parallel signal including the input digital current signals Ibe1 and Ibe2 and Ibe31 and Ibe32 and the input flag signal Iflg into a serial signal. Therefore, one transmission line is provided on the output terminal of the parallel-to-serial converter PSC, and a digital voltage signal Vpsc is output from the transmission line.

The output signal of the parallel-to-serial converter PSC is not limited to the digital voltage signal, and may be a digital current signal.

As in the first embodiment, the voltage driver VD1 amplifies the digital voltage signal Vpsc, and outputs the address information signal Vadd. The address information signal Vadd is an output signal of the address information generation circuit 20, and is extracted out of the cryocooler.

The address information signal may be used as a current signal. Further, a current driver may be provided instead of the voltage driver VD1.

Other configurations are the same as those of the first embodiment, and thus will not be described.

Fourth Embodiment

Configuration of Photon Detection Device

Figure 17:
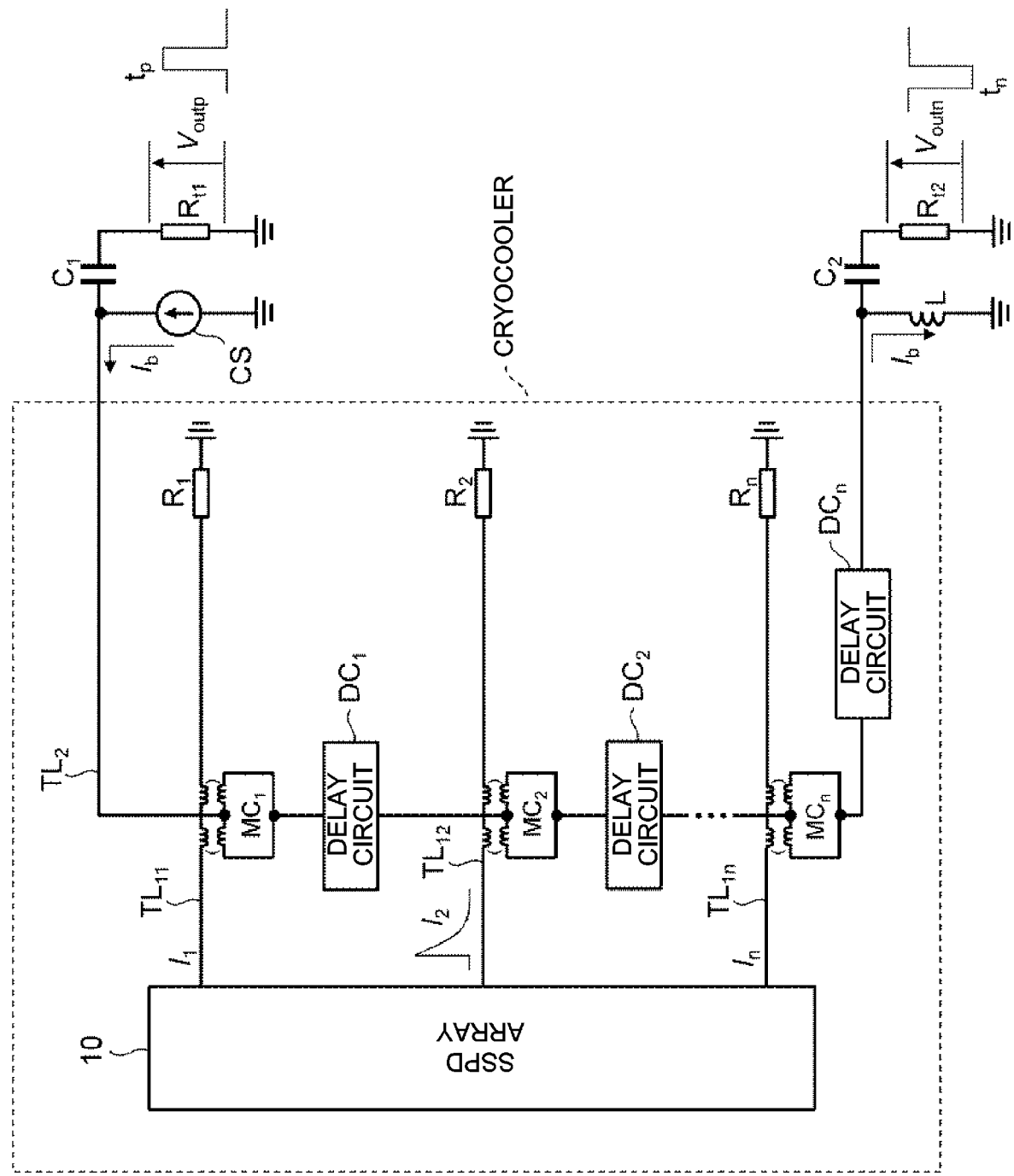
FIG. 17 is a block diagram showing a configuration of a photon detection device according to a fourth embodiment.

First, a configuration of a photon detection device according to a fourth embodiment will be described with reference to FIG. 17. FIG. 17 is a block diagram showing a configuration of a photon detection device according to the fourth embodiment. As shown in FIG. 17, the photon detection device according to the fourth embodiment includes an SSPD array 10, n (n being a natural number of 2 or more) first transmission lines TL11 to TL1$n$, one second transmission line TL2, n magnetic coupling elements MC1 to MCn, and n delay circuits DC1 to DCn, all of the components being made of a superconducting material. Further, as shown in FIG. 17, the photon detection device is housed in a cryocooler so as to maintain a superconducting state.

The SSPD array 10 includes, for example, a plurality of SSPD elements arranged in a matrix. Each of the SSPD elements includes a meander-shaped superconducting nanowire. When one photon is incident on any region of the superconducting nanowire, the region transitions transiently from a superconducting state to a normal conducting state, and a pulsed detection current is output from the SSPD element.

In addition to the SSPD elements, TES elements or other superconducting photon detectors may be used.

In the example shown in FIG. 17, the plurality of SSPD elements are connected to the first transmission lines TL11 to TL1$n$. FIG. 17 shows a state in which a pulsed detection current I2 is output from the SSPD element connected to the first transmission line TL12. When the photon detection device is an image sensor, one SSPD element corresponds to one pixel.

The plurality of SSPD elements forming the SSPD array 10 are connected to the first transmission lines but need not be connected in a one-to-one manner.

As shown in FIG. 17, leading ends of the first transmission lines TL11 to TL1$n$ extending from the SSPD array 10 are grounded via resistors R1 to Rn. The second transmission line TL2 is magnetically coupled to all of the n first transmission lines TL11 to TL1$n$ via the magnetic coupling elements MC1 to MCn.

Here, both ends of the second transmission line TL2 extend to the outside of the cryocooler. A bias current Ib is supplied to the second transmission line TL2 from a current source CS provided outside the cryocooler. Both ends of the second transmission line TL2 are provided with capacitors C1 and C2 so as to interrupt the bias current Ib which is a direct current.

More specifically, as shown in FIG. 17, one end of the capacitor C1 provided on the upstream side of the bias current Ib is connected to the current source CS. A pulse voltage (first pulse signal) Voutp is output from the other end of the capacitor C1 connected to one end of terminating resistor Rt1. The other end of the terminating resistor Rt1 is grounded.

On the other hand, as shown in FIG. 17, one end of the capacitor C2 provided on the downstream side of the bias current Ib is connected to one end of the inductor L. A pulse voltage (second pulse signal) Voutn is output from the other end of the capacitor C2 connected to one end of a terminating resistor Rt2. Here, the other end of the terminating resistor Rt2 is grounded. The other end of the inductor L is grounded, and the bias current Ib flows through the inductor L via the second transmission line TL2.

As shown in FIG. 17, the delay circuits DC1 to DCn are provided on the second transmission line TL2. Among of such delay circuits, the delay circuits DC1 to DC(n-1) are provided between the first transmission lines TL11 to TL1$n$ adjacent to each other. For example, the delay circuit DC1 is provided between the first transmission lines TL11 and TL12 adjacent to each other on the second transmission line TL2. More specifically, the delay circuit DC1 is provided between the magnetic coupling element MC1 magnetically coupled to the first transmission line TL11 and the magnetic coupling element MC2 magnetically coupled to the first transmission line TL12.

Similarly, the delay circuit DC2 is provided between the first transmission lines TL12 and TL13 (not shown) on the second transmission line TL2. More specifically, the delay circuit DC2 is provided between the magnetic coupling element MC2 magnetically coupled to the first transmission line TL12 and the magnetic coupling element MC3 (not shown) magnetically coupled to the first transmission line TL13.

The same applies to delay circuits DC3 to DC(n-1) which are not shown.

The second transmission line TL2 may be plural. For example, when n is large, the second transmission line TL2 is set to two, one second transmission line TL2 may be magnetically coupled to all of the first transmission lines TL11 to TL1($k$-1), and the other second transmission line TL2 may be magnetically coupled to all of the first transmission lines TL1$k$ to TL1$n$ (here, k being a natural number of 2<k<n).

On the other hand, as shown in FIG. 17, the delay circuit DCn is not provided between the first transmission lines adjacent to each other. One end of the delay circuit DCn is connected to one end of the magnetic coupling element MCn, and the other end of the delay circuit DCn is connected to one end of the inductor L and one end of the capacitor C2.

In this way, the magnetic coupling elements MC1 to MCn and the delay circuits DC1 to DCn are alternately connected in series on the second transmission line TL2. The bias current Ib flows through the magnetic coupling elements MC1 to MCn and the delay circuits DC1 to DCn.

Operation of Photon Detection Device

For example, as shown in FIG. 17, when the pulsed detection current I2 is output from the SSPD element connected to the first transmission line TL12, a potential difference is transiently generated across the magnetic coupling element MC2. As a result, a positive pulse voltage Voutp is output from one end of the second transmission line TL2, and a negative pulse voltage Voutn is output from the other end of the second transmission line TL2.

Assuming that a generation time of the detection current I2 is t0, an output time tp of the positive pulse voltage Voutp is delayed from the time t0 by a delay time due to the delay circuit DC1. In other words, a delay time (tp−t0) of the output time tp of the positive pulse voltage Voutp from the time t0 is equal to the delay time due to the delay circuit DC1. On the other hand, an output time tn of the negative pulse voltage Voutn is delayed from the time t0 by a delay time due to the delay circuits DC2 to DCn. In other words, a delay time (tn−t0) of the output time tn of the negative pulse voltage Voutn from the time t0 is equal to the delay time due to the delay circuits DC2 to DCn.

For comparison, consider a case in which a detection current In is generated in the first transmission line TL1n at the time t0. In this case, the delay time (tp−t0) of the output time tp of the positive pulse voltage Voutp from the time t0 is equal to the delay time due to the delay circuits DC1 to DC(n−1). On the other hand, the delay time (tn−t0) of the output time tn of the negative pulse voltage Voutn from the time t0 is equal to the delay time due to the delay circuit DCn.

As described above, a difference (tp−t0)−(tn−t0) between the delay time (tp−t0) of the positive pulse voltage Voutp and the delay time (tn−t0) of the negative pulse voltage Voutn differs depending on which of the first transmission lines TL11 to TL1n the detection current is generated in. The difference (tp−t0)−(tn−t0) between the delay times is equal to a difference (tp−tn) between output times tp and tn. Accordingly, it is possible to know which of the first transmission lines TL11 to TL1 the detection current is generated in, based on the difference (tp−tn) between the output times tp and tn. As a result, it is possible to specify the SSPD element from which the detection current is output.

On the other hand, a sum (tp+tn−2×t0) of the delay time (tp−t0) of the positive pulse voltage Voutp and the delay time (tn−t0) of the negative pulse voltage Voutn is always equal to a sum of delay times due to all of the delay circuits DC1 to DCn. In other words, the sum (tp+tn−2×t0) of the delay times is constant when the detection current is generated in any of the first transmission lines TL11 to TL1n. Accordingly, it is possible to specify the generation time t0 of the detection current based on the sum (tp+tn) of the output times tp and tn.

Description of Effects

In the photon detection device according to the present embodiment, one second transmission line TL2 is magnetically coupled to all of the n first transmission lines TL11 to TL1n via the magnetic coupling elements MC1 to MCn. Therefore, with the generation of the detection current in the first transmission lines TL11 to TL1n, the pulse voltage Voutp is output from one end of the second transmission line TL2, and the pulse voltage Voutn is output from the other end of the second transmission line TL2. Here, the delay circuits are provided between the first transmission lines adjacent to each other on the second transmission line TL2.

Therefore, as described above, based on the difference between the output times tp and tn of the pulse voltages Voutp and Voutn, it is possible to specify the SSPD element from which the detection current is output. Further, based on the sum of the output times tp and tn of the pulse voltages Voutp and Voutn, it is possible to specify the generation time t0 of the detection current.

As described above, the photon detection device according to the present embodiment has an extremely simple circuit configuration and can specify position and time at which the detection current is generated. As a result, the circuit scale and the power consumption can be significantly reduced as compared with the conventional photon detection device.

Detailed Configuration of Photon Detection Device

Figure 18:
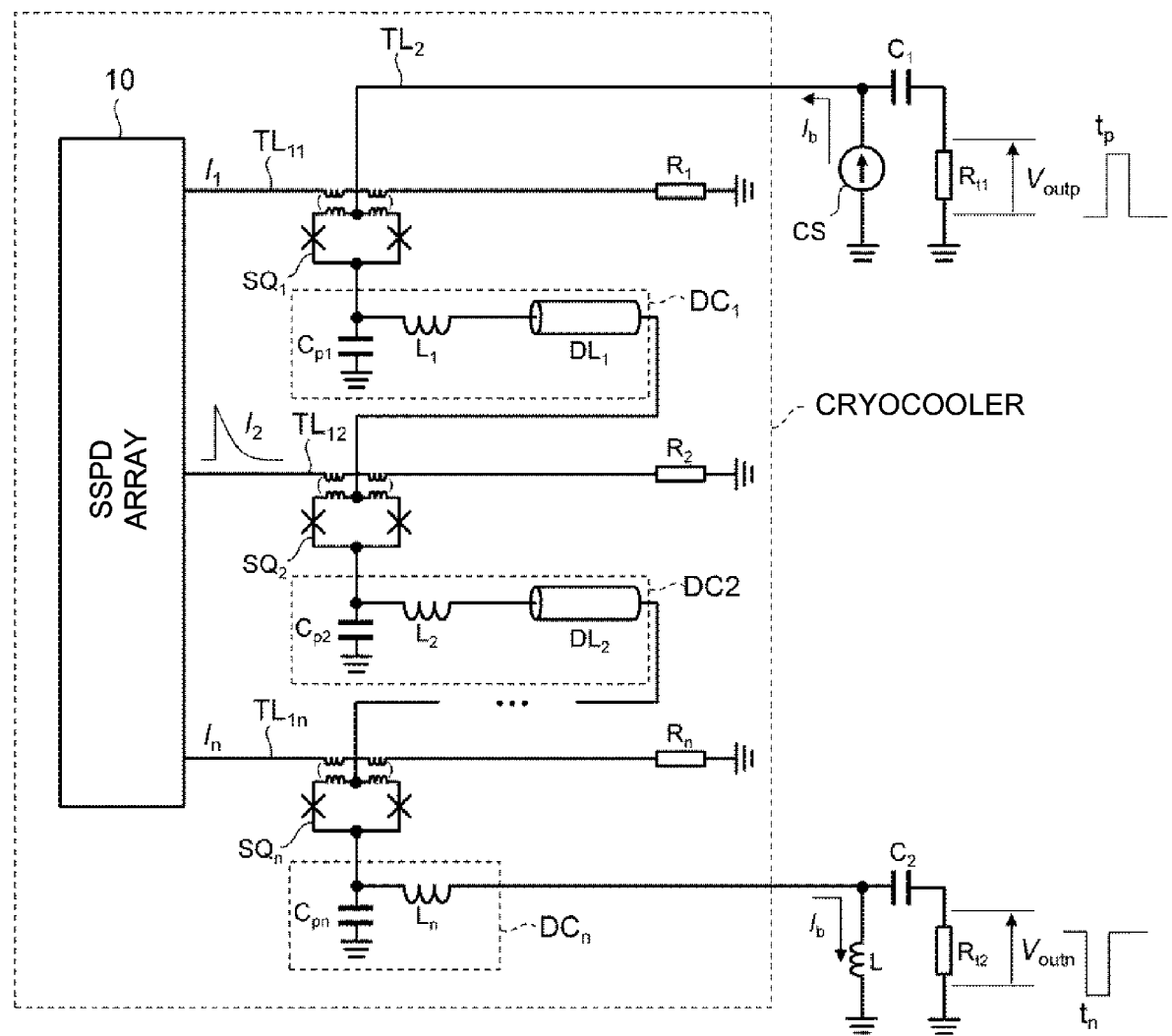
FIG. 18 is a block diagram showing a detailed configuration of the photon detection device according to the fourth embodiment.

A detailed configuration of the photon detection device according to the fourth embodiment will be described below with reference to FIG. 18. FIG. 18 is a block diagram showing a detailed configuration of the photon detection device according to the fourth embodiment shown in FIG. 17. In FIG. 18, n SSPD elements forming the SSPD array 10 are provided side by side in a row as a simple example, and are connected to n first transmission lines TL11 to TL1n in a one-to-one manner. Since the photon detection device according to the fourth embodiment is configured by the superconducting circuit, standby power in a state where the bias current is applied is zero, and the power consumption is low.

As shown in FIG. 18, the second transmission line TL2 is magnetically coupled to all of the n first transmission lines TL11 to TL1n via the SQUID elements SQ1 to SQn. Each of the SQUID elements SQ1 to SQn is an aspect of each of the magnetic coupling elements MC1 to MCn shown in FIG. 17.

Here, both ends of the second transmission line TL2 extend to the outside of the cryocooler. As the transmission line for transmitting a photon detection signal, the n first transmission lines TL11 to TL1n do not extend from the cryocooler, but only both ends of the second transmission line TL2 extend from the cryocooler, so that it is possible to prevent the temperature rise inside the cryocooler.

A bias current Ib is supplied to the second transmission line TL2 from a current source CS provided outside the cryocooler. Both ends of the second transmission line TL2 are provided with capacitors C1 and C2 so as to interrupt the bias current Ib which is a direct current.

More specifically, as shown in FIG. 18, one end of the capacitor C1 provided on the upstream side of the bias current Ib is connected to the current source CS. A pulse voltage Voutp is output from the other end of the capacitor C1 connected to one end of terminating resistor Rt1. Here, the other end of the terminating resistor Rt1 is grounded. In other words, the pulse voltage Voutp is a voltage across the terminating resistor Rt1. The terminating resistor Rt1 is an internal impedance of a measuring instrument, for example.

On the other hand, as shown in FIG. 18, one end of the capacitor C2 provided on the downstream side of the bias current Ib is connected to one end of the inductor L. A pulse voltage Voutn is output from the other end of the capacitor C2 connected to one end of a terminating resistor Rt2. Here, the other end of the terminating resistor Rt2 is grounded. In other words, the pulse voltage Voutn is a voltage across the terminating resistor Rt2. The terminating resistor Rt2 is an internal impedance of a measuring instrument, for example. The other end of the inductor L is grounded, and the bias current Ib flows through the inductor L via the second transmission line TL2.

The shown circuit configurations at both ends of the second transmission line TL2 from which the pulse voltage Voutp and the pulse voltage Voutn are output are merely examples, and not limited in any way.

The SQUID elements SQ1 to SQn and the delay circuits DC1 to DCn are alternately connected in series on the second transmission line TL2 in the cryocooler, and the bias current Ib flows through the SQUID elements SQ1 to SQn and the delay circuits DC1 to DCn. Therefore, the bias current Ib can be made constant regardless of the value of n.

One end of the SQUID element SQ1 provided on the most upstream side of the bias current Ib is connected to the current source CS and is connected to one end of the capacitor C1 at the same time. The other end of the SQUID element SQ1 is connected to one end of the delay circuit DC1, and the other end of the delay circuit DC1 is connected to one end of the SQUID element SQ2. Similarly, the other end of the SQUID element SQ2 is connected to one end of the delay circuit DC2, and the other end of the delay circuit DC2 is connected to one end of the SQUID element SQ3 (not shown).

The same applies to SQUID elements SQ3 to SQ(n−1) which are not shown.

The delay circuit DC(n−1) (not shown) is connected to one end of the SQUID element SQn provided on the most downstream side of the bias current Ib, and one end of the delay circuit DCn is connected to the other end of the SQUID element SQn. The other end of the delay circuit DCn is connected to one end of the inductor L and one end of the capacitor C2.

As shown in FIG. 18, each of the SQUID elements SQ1 to SQn is provided with inductors between a pair of Josephson junctions. The inductors provided in each of the SQUID elements SQ1 to SQn and the inductors provided in each of the first transmission lines TL11 to TL1n are arranged to face each other and are magnetically coupled to each other. In other words, the second transmission line TL2 is magnetically coupled to all of the n first transmission lines TL11 to TL1n via the SQUID elements SQ1 to SQn.

The SQUID elements SQ1 to SQn include parasitic capacitances Cp1 to Cpn, as shown in FIG. 18. Here, all capacitances of the parasitic capacitances Cp1 to Cpn are referred to as Cp.

The delay circuit DC1 is formed by the parasitic capacitance Cp1 of the SQUID element SQ1, the inductor L1, and a delay line DL1. The other end of the SQUID element SQ1 with one end connected to the capacitor C1 is connected to one end of the inductor L1 and is grounded via the parasitic capacitance Cp1 at the same time. The other end of the inductor L1 is connected to one end of the delay line DL1, and the other end of the delay line DL1 is connected to one end of the SQUID element SQ2.

Here, an inductance Lm is set such that an impedance $\sqrt{(Lm/Cp)}$ due to the parasitic capacitance Cp1 and the inductor L1 (inductance Lm) becomes equal to resistance values of the terminating resistors Rt1 and Rt2. For example, the resistance values of the terminating resistors Rt1 and Rt2 are 50Ω. In addition, the delay line DL1 is, for example, a wiring having an increased wiring length in order to increase the delay time. An impedance of the delay line DL1 is set to be equal to the resistance values of the terminating resistors Rt1 and Rt2. The delay time due to the delay circuit DC1 is a sum of a delay time $\sqrt{(Lm \cdot Cp)}$ due to the parasitic capacitance Cp1 and the inductor L1 and a delay time due to the delay line DL1, and is adjustable.

When an impedance matching circuit is provided on the second transmission line TL2, the impedance $\sqrt{(Lm/Cp)}$ due to the parasitic capacitance Cp1 and the inductor L1 (inductance Lm) and the impedance of the delay line DL1 may be set not to be equal to the resistance values of the terminating resistors Rt1 and Rt2.

Similarly, the delay circuit DC2 is formed by the parasitic capacitance Cp2 of the SQUID element SQ2, the inductor L2, and a delay line DL2. The other end of the SQUID element SQ2 with one end connected to the delay line DL1 is connected to one end of the inductor L2 and is grounded via the parasitic capacitance Cp2 at the same time. The other end of the inductor L2 is connected to one end of the delay line DL2, and the other end of the delay line DL2 is connected to one end of the SQUID element SQ3.

Here, similarly to the parasitic capacitance Cp1 and the inductor L1, both of an impedance $\sqrt{(Lm/Cp)}$ due to the parasitic capacitance Cp2 and the inductor L2 (inductance Lm) and an impedance due to the delay line DL2 are equal to the resistance values of the terminating resistors Rt1 and Rt2. A delay time due to delay circuit DC2 is a sum of a delay time $\sqrt{(Lm \cdot Cp)}$ due to the parasitic capacitance Cp2 and the inductor L2 and a delay time due to the delay line DL2, and is adjustable.

When an impedance matching circuit is provided on the second transmission line TL2, the impedance $\sqrt{(Lm/Cp)}$ due to the parasitic capacitance Cp2 and the inductor L2 (inductance Lm) and the impedance of the delay line DL2 may be set not to be equal to the resistance values of the terminating resistors Rt1 and Rt2.

The same applies to delay circuits DC3 to DC(n−1) which are not shown.

The delay circuit DCn is formed by the parasitic capacitance Cpn and the inductor Ln of the SQUID element SQn, and does not include a delay line. One end of the inductor Ln is connected to the other end of the SQUID element SQn with one end connected to the delay line DL(n−1) (not shown). The other end of the SQUID element SQn is grounded via the parasitic capacitance Cpn. The other end of the inductor Ln is connected to one end of the inductor L and one end of the capacitor C2.

The delay circuit DCn may include a delay line.

Here, similarly to the parasitic capacitance Cp1 and the inductor L1, an impedance $\sqrt{(Lm/Cp)}$ due to the parasitic capacitance Cpn and the inductor Ln (inductance Lm) is equal to the resistance values of the terminating resistors Rt1 and Rt2. A delay time due to the delay circuit DCn is a delay time $\sqrt{(Lm \cdot Cp)}$ due to the parasitic capacitance Cpn and the inductor Ln.

When an impedance matching circuit is provided on the second transmission line TL2, the impedance $\sqrt{(Lm/Cp)}$ due to the parasitic capacitance Cpn and the inductor Ln (inductance Lm) may be set not to be equal to the resistance values of the terminating resistors Rt1 and Rt2.

Operation of Photon Detection Device

For example, as shown in FIG. 18, when the pulsed detection current I2 is output from the SSPD element connected to the first transmission line TL12, a potential difference is transiently generated across the SQUID element SQ2. As a result, a positive pulse voltage Voutp is output from one end of the second transmission line TL2, and a negative pulse voltage Voutn is output from the other end of the second transmission line TL2.

Assuming that a generation time of the detection current I2 is t0, an output time tp of the positive pulse voltage Voutp is delayed from the time t0 by a delay time due to the delay circuit DC1. In other words, a delay time (tp−t0) of the output time tp of the positive pulse voltage Voutp from the time t0 is equal to the delay time due to the delay circuit DC1. On the other hand, an output time tn of the negative pulse voltage Voutn is delayed from the time t0 by a delay time due to the delay circuits DC2 to DCn. In other words, a delay time (tn−t0) of the output time tn of the negative pulse voltage Voutn from the time t0 is equal to the delay time due to the delay circuits DC2 to DCn.

For comparison, consider a case in which a detection current In is generated in the first transmission line TL1n at the time t0. In this case, the delay time (tp−t0) of the output time tp of the positive pulse voltage Voutp from the time t0 is equal to the delay time due to the delay circuits DC1 to DC(n−1). On the other hand, the delay time (tn−t0) of the output time tn of the negative pulse voltage Voutn from the time t0 is equal to the delay time due to the delay circuit DCn.

As described above, the difference (tp−t0)−(tn−t0) between the delay time (tp−t0) of the positive pulse voltage Voutp and the delay time (tn−t0) of the negative pulse voltage Voutn differs depending on which of the first transmission lines TL11 to TL1n the detection current is generated in. The difference (tp−t0)−(tn−t0) between the delay times is equal to a difference (tp−tn) between output times tp and tn. Accordingly, it is possible to know which of the first transmission lines TL11 to TL1n the detection current is generated in, based on the difference (tp−tn) between the output times tp and tn. As a result, it is possible to specify the SSPD element from which the detection current is output.

On the other hand, the sum (tp+tn−2×t0) of the delay time (tp−t0) of the positive pulse voltage Voutp and the delay time (tn−t0) of the negative pulse voltage Voutn is always equal to the sum of the delay times due to all of the delay circuits DC1 to DCn. In other words, the sum (tp+tn−2×t0) of the delay times is constant when the detection current is generated in any of the first transmission lines TL11 to TL1n. Accordingly, it is possible to specify the generation time t0 of the detection current based on the sum (tp+tn) of the output times tp and tn.

Description of Effects

In the photon detection device according to the present embodiment, one second transmission line TL2 is magnetically coupled to all of the n first transmission lines TL11 to TL1n via the SQUID elements SQ1 to SQ2. Therefore, with the generation of the detection current in the first transmission lines TL11 to TL1n, the pulse voltage Voutp is output from one end of the second transmission line TL2, and the pulse voltage Voutn is output from the other end of the second transmission line TL2. Here, the delay circuits are provided between the first transmission lines adjacent to each other on the second transmission line TL2.

Therefore, as described above, based on the difference between the output times tp and tn of the pulse voltages Voutp and Voutn, it is possible to specify the SSPD element from which the detection current is output. Further, based on the sum of the output times tp and tn of the pulse voltages Voutp and Voutn, it is possible to specify the generation time t0 of the detection current.

As described above, the photon detection device according to the present embodiment has an extremely simple circuit configuration and can specify position and time at which the detection current is generated. As a result, the circuit scale and the power consumption can be significantly reduced as compared with the conventional photon detection device.

Fifth Embodiment

Detailed Configuration of Photon Detection Device

Figure 19:
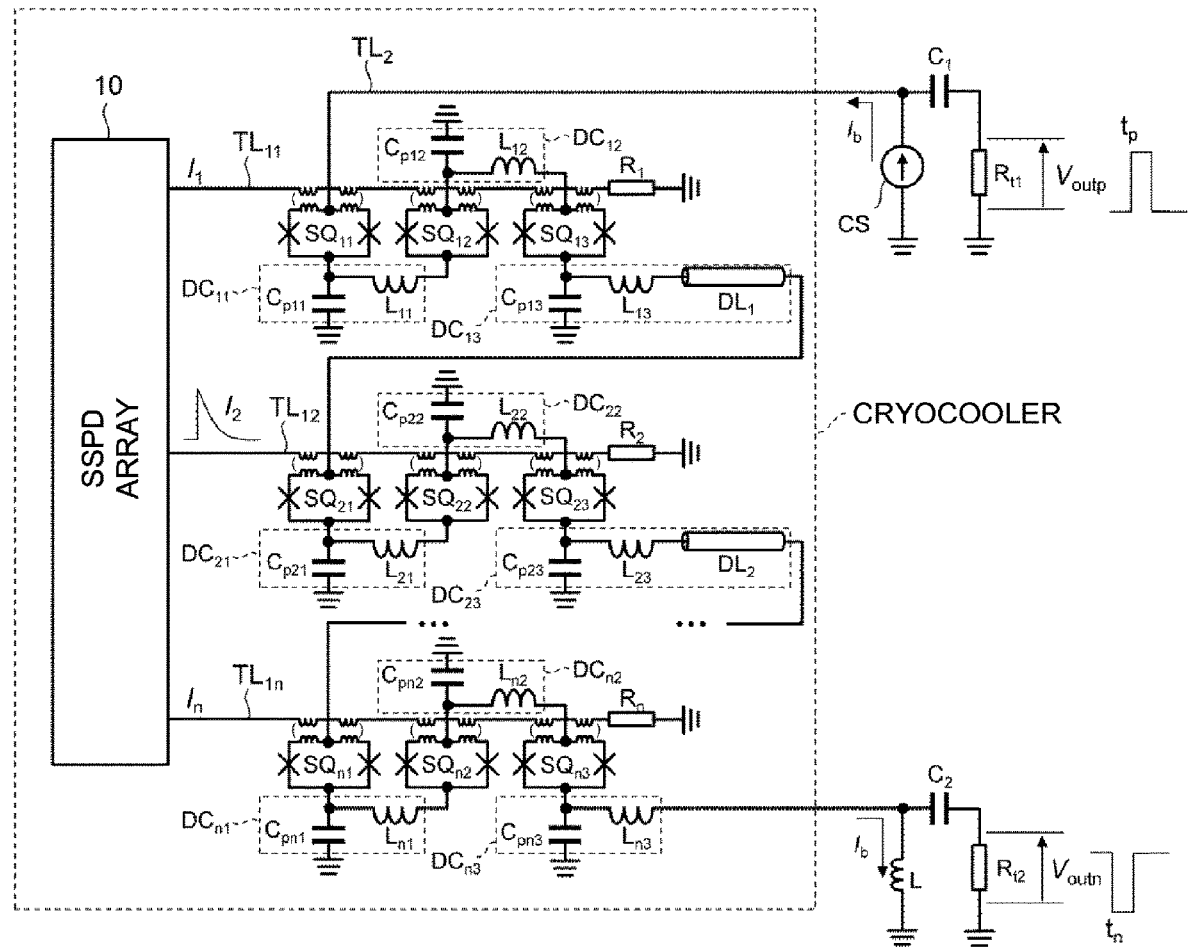
FIG. 19 is a block diagram showing a detailed configuration of a photon detection device according to a fifth embodiment.

A configuration of a photon detection device according to a fifth embodiment will be described below with reference to FIG. 19. FIG. 19 is a block diagram showing a detailed configuration of a photon detection device according to a fifth embodiment. Here, in the photon detection device according to the fourth embodiment as shown in FIG. 18, the second transmission line TL2 is magnetically coupled to each of all of the n first transmission lines TL11 to TL1n via one of the SQUID elements SQ1 to SQn.

On the other hand, in the photon detection device according to the fifth embodiment as shown in FIG. 19, a second transmission line TL2 is magnetically coupled to each of all of n first transmission lines TL11 to TL1n via each of bundles of three SQUID elements SQ11 to SQ13, SQ21 to SQ23, . . . , and SQn1 to SQn3. In addition, each of the bundles of the SQUID elements SQ11 to SQ13, SQ21 to SQ23, and SQn1 to SQn3 includes each of bundles of parasitic capacitances Cp11 to Cp13, Cp21 to Cp23, . . . , and Cpn1 to Cpn3 (all of which being referred to as capacitance Cp).

As a matter of course, the number of SQUID elements magnetically coupled to each of the first transmission lines may be plural, and is appropriately determined.

As shown in FIG. 19, the SQUID elements SQ11 to SQ13 magnetically coupled to the first transmission line TL11 are connected in series to each other via inductors L11 and L12.

More specifically, the other end of the SQUID element SQ11 with one end connected to a current source CS and a capacitor C1 is connected to one end of the inductor L11, and is grounded via the parasitic capacitance Cp11 at the same time. The other end of the inductor L11 is connected to one end of the SQUID element SQ12. A delay circuit DC11 is formed by the parasitic capacitance Cp11 and the inductor L11 (inductance Lm) of the SQUID element SQ11. An impedance $\sqrt{(Lm/Cp)}$ of the delay circuit DC11 is equal to resistance values of terminating resistors Rt1 and Rt2. A delay time due to the delay circuit DC11 is $\sqrt{(Lm \cdot Cp)}$.

The other end of the SQUID element SQ12 is connected to one end of the inductor L12, and is grounded via the parasitic capacitance Cp12 at the same time. The other end of the inductor L12 is connected to one end of the SQUID element SQ13. A delay circuit DC12 is formed by the parasitic capacitance Cp12 and the inductor L12 (inductance Lm) of the SQUID element SQ12. An impedance $\sqrt{(Lm/Cp)}$ of the delay circuit DC12 is also equal to the resistance values of the terminating resistors Rt1 and Rt2. A delay time due to the delay circuit DC12 is also $\sqrt{(Lm \cdot Cp)}$.

The other end of the SQUID element SQ13 is connected to one end of the inductor L13, and is grounded via the parasitic capacitance Cp13 at the same time. The other end of the inductor L13 is connected to one end of the delay line DL1, and the other end of the delay line DL1 is connected to one end of the SQUID element SQ21. A delay circuit DC13 is formed by the parasitic capacitance Cp13 of the SQUID element SQ13, the inductor L13 (inductance Lm), and the delay line DL1. Both of an impedance $\sqrt{(Lm/Cp)}$ due to the parasitic capacitance Cp13 and the inductor L13 and an impedance of a delay line DL2 are equal to the resistance values of the terminating resistors Rt1 and Rt2. A delay time due to the delay circuit DC13 is a sum of the delay time $\sqrt{(Lm \cdot Cp)}$ due to the parasitic capacitance Cp13 and the inductor L13 and the delay time due to the delay line DL1.

As in the fourth embodiment, when an impedance matching circuit is provided on the second transmission line TL2, the impedance $\sqrt{(Lm/Cp)}$ due to the parasitic capacitances Cp11 to Cp13 and the inductors L11 to L13 (inductance Lm) and the impedance of the delay line DL1 may be set not to be equal to the resistance values of the terminating resistors Rt1 and Rt2. The same applies to the following description.

Similarly, as shown in FIG. 19, the SQUID elements SQ21 to SQ23 magnetically coupled to the first transmission line TL12 are connected in series to each other via inductors L21 and L22.

More specifically, the other end of the SQUID element SQ21 with one end connected to the delay line DL1 is connected to one end of the inductor L21. The other end of the SQUID element SQ21 is grounded by the parasitic capacitance Cp21. The other end of the inductor L21 is connected to one end of the SQUID element SQ22. A delay circuit DC21 is formed by the parasitic capacitance Cp21 of the SQUID element SQ21 and the inductor L21 (inductance Lm). An impedance $\sqrt{(Lm/Cp)}$ of the delay circuit DC21 is also equal to the resistance values of the terminating resistors Rt1 and Rt2. A delay time due to the delay circuit DC21 is also $\sqrt{(Lm \cdot Cp)}$.

The other end of the SQUID element SQ22 is connected to one end of the inductor L22. The other end of the SQUID element SQ22 is grounded via the parasitic capacitance Cp22. The other end of the inductor L22 is connected to one end of the SQUID element SQ23. A delay circuit DC22 is formed by the parasitic capacitance Cp22 and the inductor L22 (inductance Lm) of the SQUID element SQ22. An impedance $\sqrt{(Lm/Cp)}$ of the delay circuit DC22 is also equal to the resistance values of the terminating resistors Rt1 and Rt2. A delay time due to the delay circuit DC22 is also $\sqrt{(Lm \cdot Cp)}$.

The other end of the SQUID element SQ23 is connected to one end of the inductor L23. The other end of the SQUID element SQ23 is grounded via the parasitic capacitance Cp23. The other end of the inductor L23 is connected to one end of the delay line DL2, and the other end of the delay line DL2 is connected to one end of the SQUID element SQ31 (not shown). A delay circuit DC23 is formed by the parasitic capacitance Cp23, the inductor L23 (inductance Lm), and the delay line DL2 of the SQUID element SQ23. Both of an impedance (Lm/Cp) due to the parasitic capacitance Cp23 and the inductor L23 and the impedance of the delay line DL2 are equal to the resistance values of the terminating resistors Rt1 and Rt2. A delay time due to the delay circuit DC23 is a sum of the delay time $\sqrt{(Lm \cdot Cp)}$ due to the parasitic capacitance Cp23 and the inductor L23 and the delay time due to the delay line DL2.

Similarly, as shown in FIG. 19, the SQUID elements SQn1 to SQn3 magnetically coupled to the first transmission line TL1n are connected in series to each other via inductors Ln1 and Ln2.

More specifically, the other end of the SQUID element SQn1 with one end connected to a delay line DL(n−1) (not shown) is connected to one end of the inductor Ln1. The other end of the SQUID element SQn1 is grounded via the parasitic capacitance Cpn1. The other end of the inductor Ln1 is connected to one end of the SQUID element SQn2. A delay circuit DCn1 is formed by the parasitic capacitance Cpn1 of the SQUID element SQn1 and the inductor Ln1 (inductance Lm). An impedance $\sqrt{(Lm/Cp)}$ of the delay circuit DCn1 is also equal to the resistance values of the terminating resistors Rt1 and Rt2. A delay time due to the delay circuit DCn1 is also (Lm·Cp).

The other end of the SQUID element SQn2 is connected to one end of the inductor Ln2. The other end of the SQUID element SQn2 is grounded via the parasitic capacitance Cpn2. The other end of the inductor Ln2 is connected to one end of the SQUID element SQn3. A delay circuit DCn2 is formed by the parasitic capacitance Cpn2 of the SQUID element SQn2 and the inductor Ln2 (inductance Lm). An impedance $\sqrt{(Lm/Cp)}$ of the delay circuit DCn2 is also equal to the resistance values of the terminating resistors Rt1 and Rt2. A delay time due to the delay circuit DCn2 is also $\sqrt{(Lm \cdot Cp)}$.

The other end of the SQUID element SQn3 is connected to one end of the inductor Ln3. The other end of the SQUID element SQn3 is grounded via the parasitic capacitance Cpn3. The other end of the inductor Ln3 is connected to one end of the inductor L and one end of the capacitor C2. A delay circuit DCn3 is formed by the parasitic capacitance Cpn3 and the inductor Ln3 (inductance Lm) of the SQUID element SQn3. An impedance $\sqrt{(Lm/Cp)}$ of the delay circuit DCn3 is also equal to the resistance values of the terminating resistors Rt1 and Rt2. A delay time due to the delay circuit DCn3 is also $\sqrt{(Lm \cdot Cp)}$.

The same applies to SQUID elements SQ31 to SQ33, . . . , and SQ(n−1)1 to SQ(n−1)3 which are not shown.

For example, as shown in FIG. 19, when a detection current I2 is output from the SSPD element connected to the first transmission line TL12, a potential difference is transiently generated across each of the SQUID elements SQ21 to SQ23. As a result, a positive pulse voltage Voutp is output from one end of the second transmission line TL2, and a negative pulse voltage Voutn is output from the other end of the second transmission line TL2 at the same time.

In the fifth embodiment, since the number of SQUID elements magnetically coupled to the first transmission line TL12 is larger than that in the fourth embodiment shown in FIG. 18, the positive pulse voltage Voutp and the negative pulse voltage Voutn can be increased in amplitude.

The same applies to the other first transmission lines.

Other configurations are the same as those of the photon detection device according to the fourth embodiment, and thus will not be described. Similarly to the photon detection device according to the fourth embodiment, the photon detection device according to the fifth embodiment also has an extremely simple circuit configuration and can specify position and time at which the detection current is generated. As a result, the circuit scale and the power consumption can be significantly reduced as compared with the conventional photon detection device.

Operation of Photon Detection Device

Figure 20:
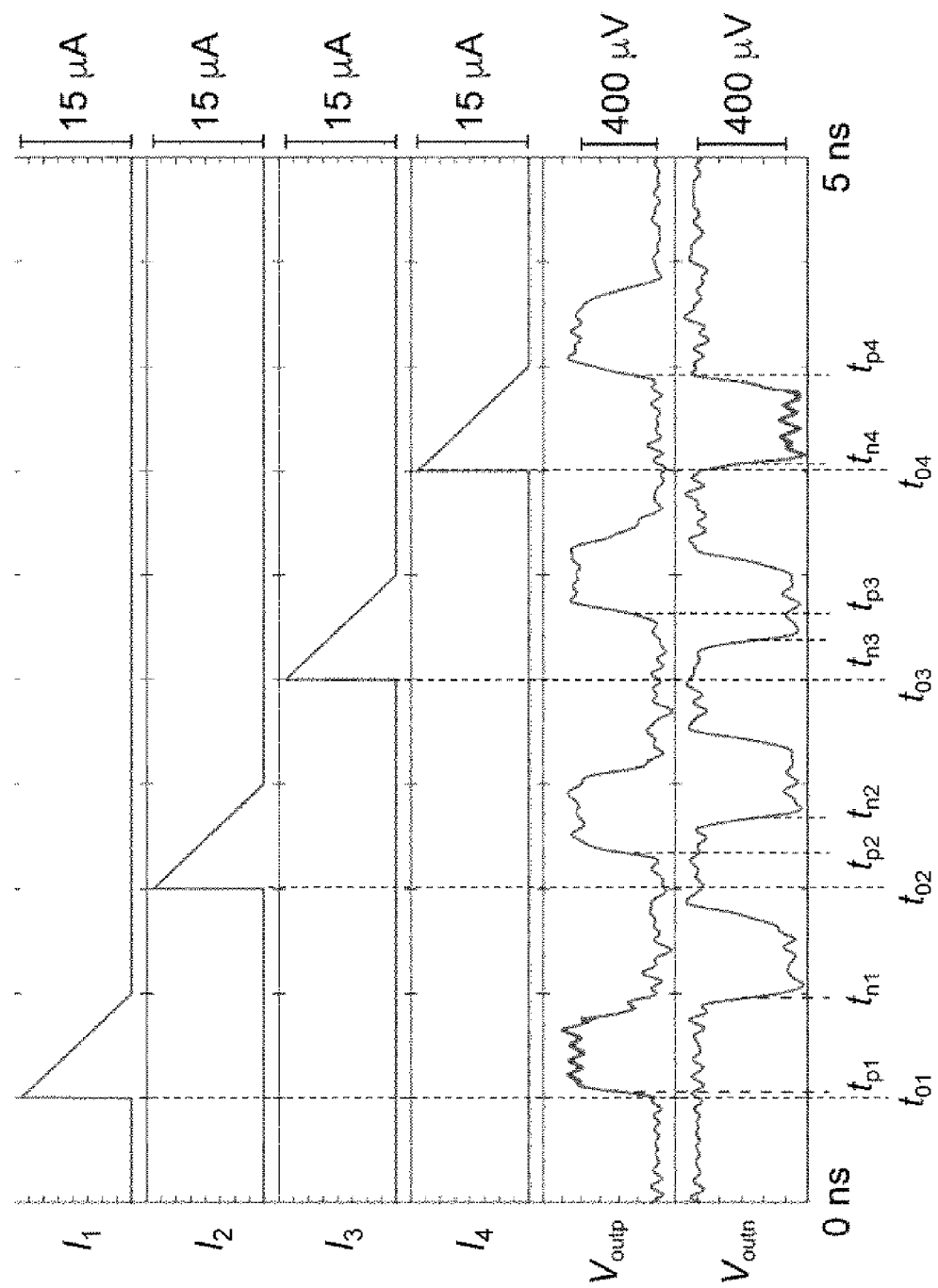
FIG. 20 is a timing chart for illustrating an operation of the photon detection device according to the fifth embodiment.

Here, FIG. 20 is a timing chart showing an operation of the photon detection device according to the fifth embodiment. FIG. 20 shows a case of n=4.

In the example of FIG. 20, first, a positive pulse voltage Voutp is output at time tp1 with a detection current I1 generated in the first transmission line TL11 at time t01, and a negative pulse voltage Voutn is output at time tn1.

Next, a positive pulse voltage Voutp is output at time tp2 with a detection current I2 generated in the first transmission line TL12 at time t02, and then a negative pulse voltage Voutn is output at time tn2.

Next, a negative pulse voltage Voutn is output at time tn3 with a detection current I3 generated in the first transmission line TL13 at time t03, and then a positive pulse voltage Voutp is output at time tp3.

Finally, a negative pulse voltage Voutn is output at time tn4 with a detection current I4 generated in the first transmission line TL14 at time t04, and then a positive pulse voltage Voutp is output at time tp4.

As shown in FIG. 20, differences (tp1−tn1), (tp2−tn2), (tp3−tn3), and (tp4−tn4) in output time between the positive pulse voltage Voutp and the negative pulse voltage Voutn differ from each other. Therefore, it is possible to know which of the first transmission lines TL11 to TL14 the detection current is generated in.

On the other hand, all of sums (tp1−t01)+(tn1−t01), (tp2−t02)+(tn2−t02), (tp3−t03)+(tn3−t03), and (tp4−t04)+(tn4−t04) of delay times of the positive pulse voltage Voutp and delay times of the negative pulse voltage Voutn are equal. Accordingly, it is possible to specify generation times t01, t02, t03, and t04 of the detection currents I1 to I4 based on the sum of the output time.

Sixth Embodiment

Detailed Configuration of Photon Detection Device

Figure 21:
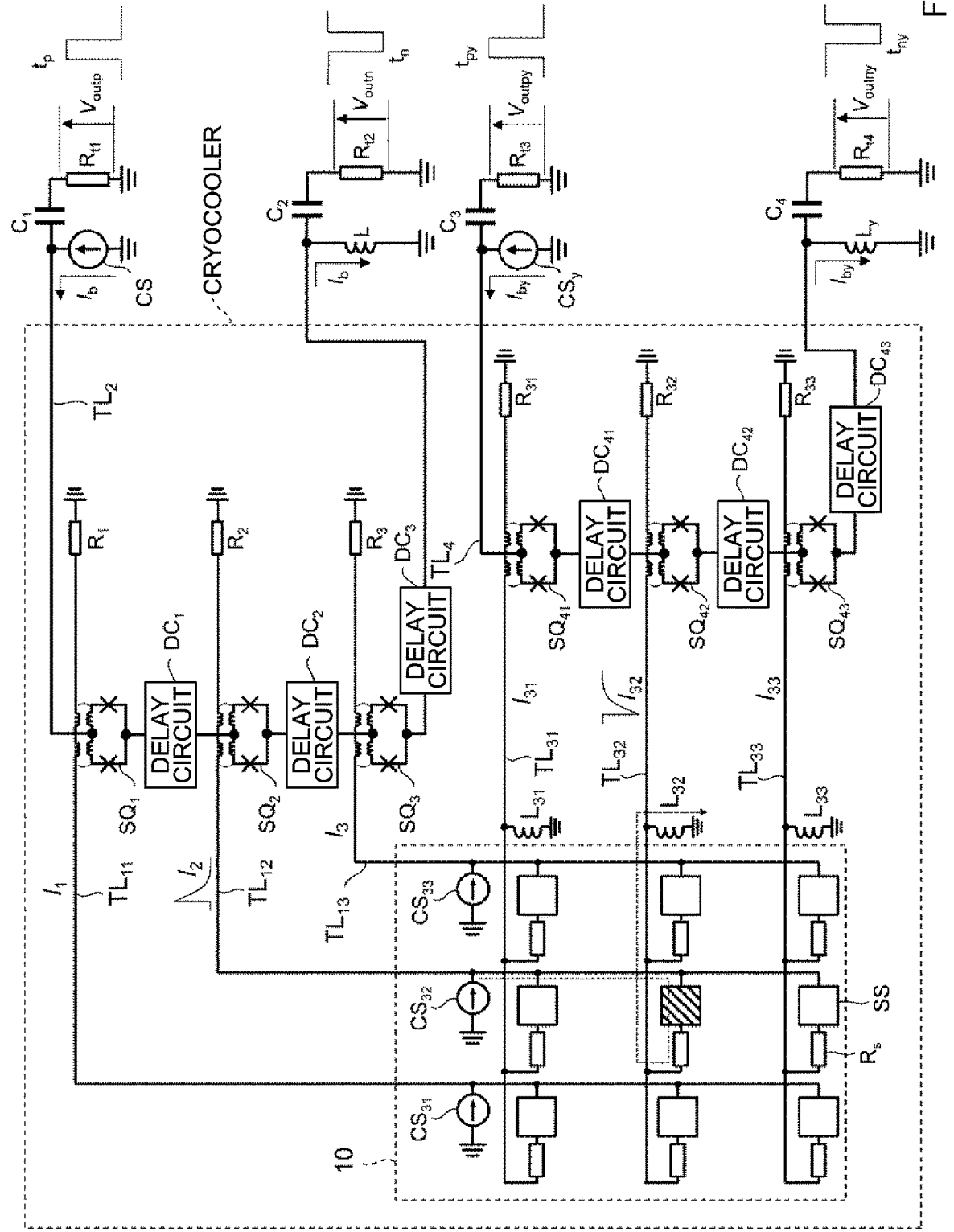
FIG. 21 is a block diagram showing a detailed configuration of a photon detection device according to a sixth embodiment.

A configuration of a photon detection device according to a sixth embodiment will be described below with reference to FIG. 21. FIG. 21 is a block diagram showing a detailed configuration of the photon detection device according to the sixth embodiment. As shown in FIG. 21, in the photon detection device according to the sixth embodiment, 9 SSPD elements SS are arranged with 3 rows×3 columns in a matrix in an SSPD array 10.

As shown in FIG. 21, the photon detection device according to the sixth embodiment further includes third transmission lines TL31 to TL33, one fourth transmission line TL4, three SQUID elements SQ41 to SQ43, and three delay circuits DC41 to DC43 in addition to the components of the photon detection device (in the case of n=3) according to the fourth embodiment shown in FIG. 18.

Here, FIG. 21 shows details of the SSPD array 10. The SSPD array 10 includes 9 SSPD elements SS, 9 resistor elements Rs, three current sources CS31 to CS33, and three inductors L31 to L33. As shown in FIG. 21, one end of each of the SSPD elements SS is connected to one of the first transmission lines TL11 to TL13. Each of the other ends of the SSPD elements SS is connected to one of the third transmission lines TL31 to TL33 via each of the resistor elements Rs.

Bias currents are supplied from the three current sources CS31 to CS33 to the first transmission lines TL11 to TL13. For example, the bias current is supplied from the current source CS32 to the three SSPD elements SS connected to the first transmission line TL12.

The other ends of the three inductors L31 to L33 with one end grounded are connected to the third transmission lines TL31 to TL33.

In FIG. 21, the three first transmission lines TL11 to TL13 are provided corresponding to the columns of the SSPD elements SS. In other words, each of the first transmission lines TL11 to TL13 is commonly connected to the three SSPD elements SS arranged in a vertical direction of the drawing. For example, when a photon is incident on any of the three SSPD elements SS connected to the first transmission line TL12, a detection current I2 is output.

Further, in the photon detection device according to the sixth embodiment, the three third transmission lines TL31 to TL33 are provided corresponding to the rows of the SSPD elements. In other words, each of the third transmission lines TL31 to TL33 is commonly connected to the three SSPD elements arranged in a horizontal direction of the drawing. For example, when a photon is incident on any of the three SSPD elements connected to the third transmission line TL32, a detection current I32 is output. Here, leading ends of the third transmission lines TL31 to TL33 extending from the SSPD array 10 are grounded via resistors R31 to R33.

The fourth transmission line TL4 is magnetically coupled to all of the three third transmission lines TL31 to TL33 via the SQUID elements SQ41 to SQ43. Here, similarly to both ends of the second transmission line TL2, both ends of the fourth transmission line TL4 extend to the outside of the cryocooler. As the transmission line for transmitting a photon detection signal, the first transmission lines TL11 to TL13 and the third transmission lines TL31 to TL33 do not extend from the cryocooler, but only both ends of the second transmission line TL2 and the fourth transmission line TL4 extend from the cryocooler, so that it is possible to prevent the temperature rise inside the cryocooler.

A bias current Iby is supplied to the fourth transmission line TL4 from a current source CSy provided outside the cryocooler. Both ends of the fourth transmission line TL4 are provided with capacitors C3 and C4 so as to interrupt the bias current Iby which is a direct current.

More specifically, as shown in FIG. 21, one end of the capacitor C3 provided on the upstream side of the bias current Iby is connected to the current source CSy. A pulse voltage Voutpy is output from the other end of the capacitor C3 connected to one end of terminating resistor Rt3. Here, the other end of the terminating resistor Rt3 is grounded.

On the other hand, as shown in FIG. 21, one end of the capacitor C4 provided on the downstream side of the bias current Iby is connected to one end of the inductor Ly. A pulse voltage Voutny is output from the other end of the capacitor C4 connected to one end of a terminating resistor Rt4. Here, the other end of the terminating resistor Rt4 is grounded. The other end of the inductor Ly is grounded, and the bias current Iby flows through the inductor Ly via the fourth transmission line TL4.

The SQUID elements SQ41 to SQ43 and the delay circuits DC41 to DC43 are alternately connected in series on the fourth transmission line TL4 in the cryocooler, and the bias current Iby flows through the SQUID elements SQ41 to SQ43 and the delay circuits DC41 to DC43.

One end of the SQUID element SQ41 provided on the most upstream side of the bias current Iby is connected to the current source CSy and is connected to one end of the capacitor C3 at the same time. The other end of the SQUID element SQ41 is connected to one end of the delay circuit DC41, and the other end of the delay circuit DC41 is connected to one end of the SQUID element SQ42.

Similarly, the other end of the SQUID element SQ42 is connected to one end of the delay circuit DC42, and the other end of the delay circuit DC42 is connected to one end of the SQUID element SQ43 provided on the most downstream side of the bias current Ib.

One end of the delay circuit DC43 is connected to the other end of the SQUID element SQ43. The other end of the delay circuit DC43 is connected to one end of the inductor Ly and one end of the capacitor C4.

Other configurations are the same as those of the fourth embodiment, and thus will not be described.

Operation of Photon Detection Device

Here, attention is paid to the SSPD element SS with diagonal lines.

Such an SSPD element SS is connected to the first transmission line TL12 and the third transmission line TL32. Normally, a bias current supplied from the current source CS32 flows through the inductor L32 via the first transmission line TL12, the SSPD element SS, the resistor element Rs, and the third transmission line TL32 as indicated by a broken line arrow in FIG. 21. Here, since the resistor R2 is provided at the leading end of the first transmission line TL12, almost no bias current flows toward the resistor R2 from the current source CS32. Since the resistor R32 is provided at the leading end of the third transmission line TL32, almost no bias current flows toward the resistor R32.

On the other hand, when a photon is incident on the SSPD element SS with the diagonal lines, a resistance is transiently generated in the SSPD element SS. Therefore, the bias current flows toward the resistor R2 from the current source CS32 in the first transmission line TL12, and a positive detection current I2 is generated. At the same time, since the bias current flowing through the inductor L32 is reduced, a current flows into the inductor L32 from the resistor R32 in the third transmission line TL32, and a negative detection current I32 is generated.

The detection currents I2 and I32 are generated at time t0, and a potential difference is transiently generated across each of the SQUID element SQ2 coupled to the first transmission line TL12 and the SQUID element SQ42 coupled to the third transmission line TL32. As a result, a positive pulse voltage Voutp is output from one end of the second transmission line TL2 at time tp, and a negative pulse voltage Voutn is output from the other end of the second transmission line TL2 at time tn. Further, a positive pulse voltage Voutpy is output from one end of the fourth transmission line TL4 at time tpy, and a negative pulse voltage Voutny is output from the other end of the fourth transmission line TL4 at time tny.

As described in the fourth embodiment, a difference (tp–t0)–(tn–t0) between the delay time (tp–t0) of the positive pulse voltage Voutp and the delay time (tn–t0) of the negative pulse voltage Voutn differs depending on which of the first transmission lines TL11 to TL13 the detection current is generated in. The difference (tp–t0)–(tn–t0) between the delay times is equal to a difference (tp–tn) between the output times tp and tn. Accordingly, it is possible to know which of the first transmission lines TL11 to TL13 the detection current is generated in, based on the difference (tp–tn) between the output times tp and tn.

Similarly, a difference (tpy–t0)–(tny–t0) between the delay time (tpy–t0) of the positive pulse voltage Voutpy and the delay time (tny–t0) of the negative pulse voltage Voutny differs depending on which of the third transmission lines TL31 to TL33 the detection current is generated in. The difference (tpy–t0)–(tny–t0) between the delay times is equal to a difference (tpy–tny) between the output times tpy and tny. Accordingly, it is possible to know which of the third transmission lines TL31 to TL33 the detection current is generated in, based on the difference (tpy–tny) between the output times tpy and tny.

As described above, since it is possible to know which of the first transmission lines TL11 to TL13 and which of the third transmission lines TL31 to TL33 the detection current is generated in, it is possible to specify the SSPD element from which the detection current is output. In the example of FIG. 21, the detection current is output from the SSPD element connected to the first transmission line TL12 and the third transmission line TL32.

On the other hand, the sum (tp+tn−2×t0) of the delay time (tp–t0) of the positive pulse voltage Voutp and the delay time (tn–t0) of the negative pulse voltage Voutn is always equal to the sum of delay times due to all of the delay circuits DC41 to DC43. In other words, the sum (tp+tn−2×t0) of the delay times is constant when the detection current is generated in any of the first transmission lines TL11 to TL13. Accordingly, it is possible to specify the generation time t0 of the detection current based on the sum (tp+tn) of the output times tp and tn.

Similarly, a sum (tpy+tny−2×t0) of the delay time (tpy–t0) of the positive pulse voltage Voutpy and the delay time (tny–t0) of the negative pulse voltage Voutny is always equal to a sum of delay times due to all of the delay circuits DC41 to DC43. In other words, the sum (tpy+tny−2×t0) of the delay times is constant when the detection current is generated in any of the third transmission lines TL31 to TL33. Accordingly, it is possible to specify the generation time t0 of the detection current based on the sum (tpy+tny) of the output times tpy and tny.

Accordingly, the generation time t0 can be specified based on either of the sum of the output times tp and tn or the sum of the output times tpy and tny. An average value of the generation time t0 obtained from the sum of the output times tp and tn and the generation time t0 obtained from the sum of the output times tpy and tny may be adopted.

As described above, even in the photon detection device in which the SSPD elements are arranged in a matrix, it is possible to specify the position and the time at which the detection current is generated, with an extremely simple circuit configuration. As a result, the circuit scale and the power consumption can be significantly reduced as compared with the conventional photon detection device.

Seventh Embodiment

Detailed Configuration of Photon Detection Device

Figure 22:
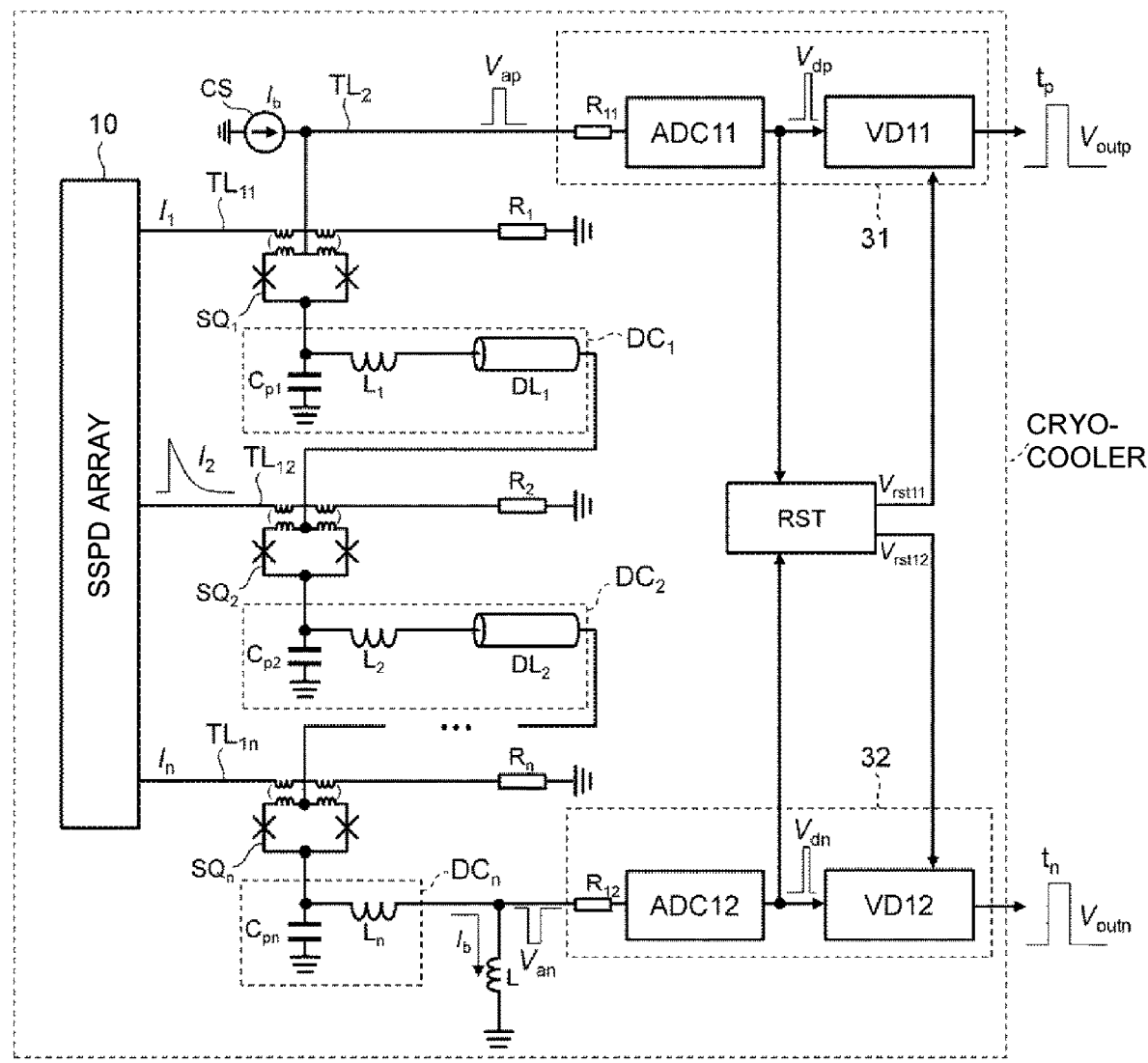
FIG. 22 is a block diagram showing a detailed configuration of a photon detection device according to a seventh embodiment.

A configuration of a photon detection device according to a seventh embodiment will be described below with reference to FIG. 22. FIG. 22 is a block diagram showing a detailed configuration of a photon detection device according to a seventh embodiment. As shown in FIG. 22, in the photon detection device according to the seventh embodiment, time information generation circuits 31 and 32 and a reset circuit RST are provided in the cryocooler compared with the photon detection device according to the fourth embodiment shown in FIG. 18. In addition, the current source CS is provided outside the cryocooler in FIG. 18, but is provided inside the cryocooler in FIG. 22.

As shown in FIG. 22, the time information generation circuits 31 and 32 are provided at both ends of the second transmission line TL2 and have the same configuration as the time information generation circuit 30 shown in FIGS. 2 and 4.

Specifically, the time information generation circuit 31 is provided at one end of the second transmission line TL2, and includes a resistor element R11, an analog-to-digital converter ADC11, and a voltage driver VD11. The time information generation circuit 32 is provided at the other end of the second transmission line TL2, and includes a resistor element R12, an analog-to-digital converter ADC12, and a voltage driver VD12.

The analog-to-digital converters ADC11 and ADC12 correspond to the analog-to-digital converter ADC (that is, the DC-to-SFQ converter DSC shown in FIG. 4) shown in FIG. 2, and have the similar detailed circuit configuration. In addition, the voltage drivers VD11 and VD12 correspond to the voltage driver VD2 shown in FIGS. 2 and 4, and have the same detailed circuit configuration.

For example, as shown in FIG. 22, when a pulsed detection current I2 is output from the SSPD element connected to the first transmission line TL12, a potential difference is transiently generated across the SQUID element SQ2. As a result, a positive analog pulse voltage Vap is input to the analog-to-digital converter ADC11 connected to one end of the second transmission line TL2, via a resistor R11. The analog-to-digital converter ADC11 converts the analog pulse voltage Vap into a digital voltage signal Vdp. On the other hand, a negative analog pulse voltage Van is input to the analog-to-digital converter ADC12 connected to the other end of the second transmission line TL2, via a resistor R12. The analog-to-digital converter ADC12 inverts the analog pulse voltage Van and converts it into a digital voltage signal Vdn.

The voltage driver VD11 amplifies the digital voltage signal Vdp, and outputs a time information signal Voutp. The time information signal Voutp is an output signal of the time information generation circuit 31, and is extracted out of the cryocooler. Similarly, the voltage driver VD12 amplifies the digital voltage signal Vdn, and outputs a time information signal Voutn. The time information signal Voutn is an output signal of the time information generation circuit 32, and is extracted out of the cryocooler.

The digital voltage signal Vdn and the time information signal Voutn may be used as negative voltage signals without inversion of the analog pulse voltage Van.

The reset circuit RST generates reset signals Vrst11 and Vrst12 based on the digital voltage signals Vdp and Vdn output from the analog-to-digital converters ADC11 and ADC12. When both the digital voltage signals Vdp and Vdn are input to the reset circuit RST, the reset circuit RST outputs the reset signals Vrst11 and Vrst12.

The reset signal Vrst11 is input to the voltage driver VD11, and the reset signal Vrst12 is input to the voltage driver VD12. A value of the time information signal Voutp, which has been switched from "0" to "1" with the generation of the detection current I2, is reset from "1" to "0" by the reset signal Vrst11. Similarly, a value of the time information signal Voutn, which has been switched from "0" to "1" with the generation of the detection current I2, is reset from "1" to "0" by the reset signal Vrst12.

A method of resetting the time information signals Voutp and Voutn shown in FIG. 22 is merely an example, and various other methods can be considered.

As in the fourth embodiment, the generation time of the detection current is t0, the output time (rising time) of the time information signal Voutp is tp, and the output time (rising time) of the time information signal Voutn is tn. In such a case, as in the fourth embodiment, it is possible to know which of the first transmission lines TL11 to TL1$n$ the detection current is generated in, based on the difference (tp−tn) of the output times tp and tn. In addition, it is possible to specify the generation time t0 of the detection current based on the sum (tp+tn) of the output times tp and tn.

In the fifth embodiment, as compared with the fourth embodiment, as the number of SQUID elements magnetically coupled to the first transmission lines TL11 to TL1$n$ increases, the amplitudes of the positive pulse voltage Voutp and the negative pulse voltage Voutn are made larger. On the other hand, in the present embodiment, the time information generation circuits 31 and 32 are provided, so that the amplitudes of the output signals (time information signals Voutp and Voutn) are made large without the increase of the number of SQUID elements magnetically coupled to the first transmission lines TL11 to TL1$n$.

Here, as compared with the fifth embodiment in which the number of SQUID elements magnetically coupled to the first transmission lines is increased, the increase in the circuit space can be prevented in the present embodiment in which the time information generation circuits 31 and 32 are provided.

Other configurations are the same as those of the photon detection device according to the fourth embodiment, and thus will not be described.

As a matter of course, the sixth embodiment shown in FIG. 21 and the present embodiment may be combined.

Eighth Embodiment

Detailed Configuration of Photon Detection Device

Figure 23:
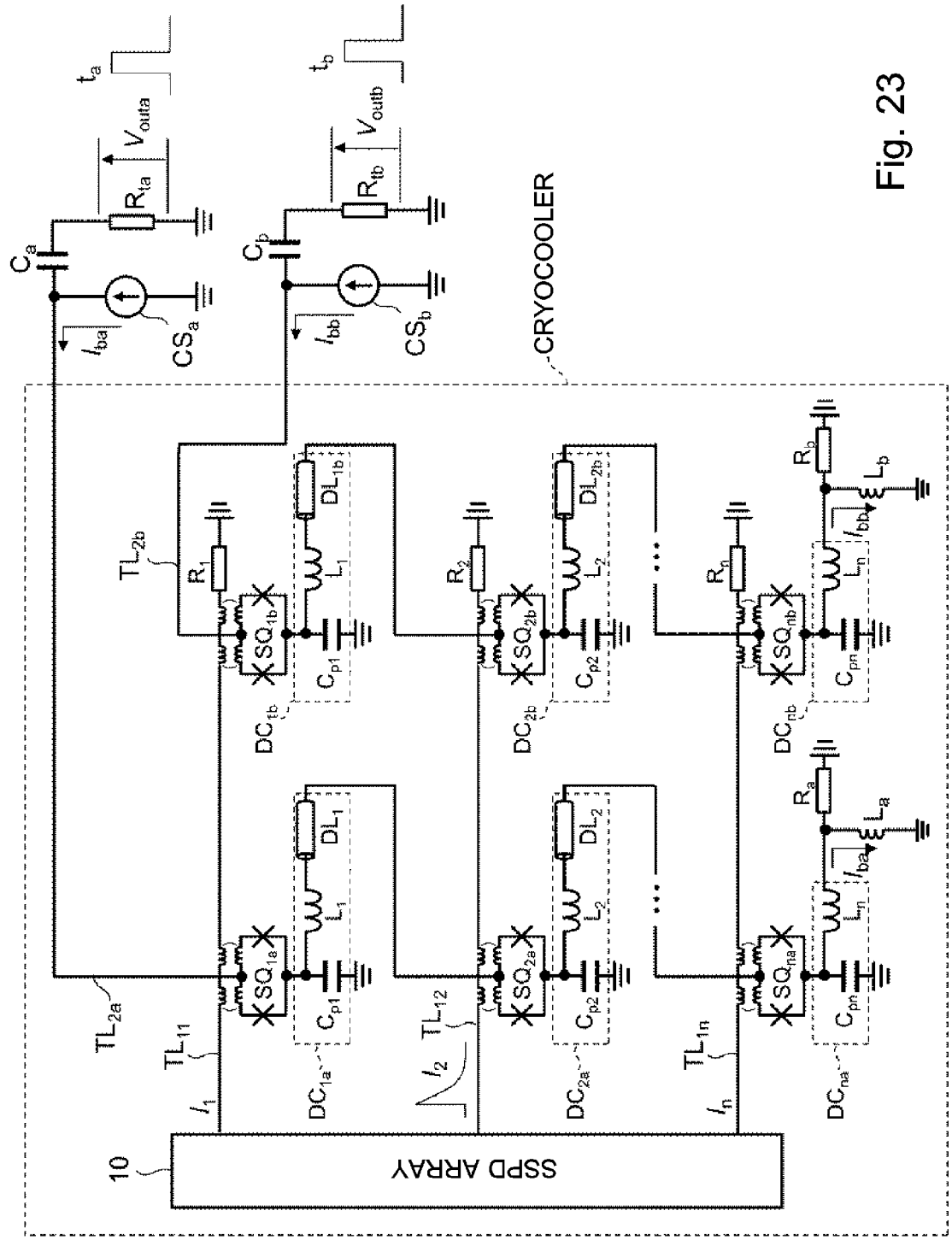
FIG. 23 is a block diagram showing a detailed configuration of a photon detection device according to an eighth embodiment.

A configuration of a photon detection device according to an eighth embodiment will be described below with reference to FIG. 23. FIG. 23 is a block diagram showing a detailed configuration of a photon detection device according to an eighth embodiment.

Here, in the photon detection device according to the fourth embodiment shown in FIG. 18, the second transmission line TL2 is magnetically coupled to each of all of the n first transmission lines TL11 to TL1$n$ via one of the SQUID elements SQ1 to SQn. The position and the time of generation of the detection current is specified using the positive pulse voltage Voutp and the negative pulse voltage Voutn to be output from both ends of the second transmission line TL2.

On the other hand, in the photon detection device according to the eighth embodiment shown in FIG. 23, a pair of second transmission lines TL2$a$ and TL2$b$ are provided. The second transmission line TL2$a$ is magnetically coupled to each of all of n first transmission lines TL11 to TL1$n$ via one of SQUID elements SQ1$a$ to SQn$a$. Similarly, the second transmission line TL2$b$ is magnetically coupled to each of all of n first transmission lines TL11 to TL1$n$ via one of SQUID elements SQ1$b$ to SQn$b$. Only one end of each of the second transmission lines TL2$a$ and TL2$b$ extends to the outside of the cryocooler, and a position and a time of generation of a detection current are specified using positive pulse voltages Vouta and Voutb to be output from the respective one ends.

More specifically, as shown in FIG. 23, a bias current Iba is supplied to the second transmission line TL2$a$ from a current source CSa provided outside the cryocooler. A capacitor Ca is provided at one end of the second transmission line TL2$a$ so as to interrupt the bias current Iba which is a direct current. One end of the capacitor Ca is connected to the current source CSa. A pulse voltage Vouta is output from the other end of the capacitor Ca connected to one end of a terminating resistor Rta. Here, the other end of the terminating resistor Rta is grounded.

On the other hand, one end of the second transmission line TL2$a$ located on the downstream side of the bias current Iba is grounded via a resistor Ra. The other end of the resistor Ra with one end grounded is connected to the other end of an inductor La with one end grounded, and the bias current Iba flows through the inductor La via the second transmission line TL2$a$.

The second transmission line TL2$b$ is also the same as the second transmission line TL2$a$.

More specifically, as shown in FIG. 23, a bias current Ibb is supplied to the second transmission line TL2$b$ from a current source CSb provided outside the cryocooler. A capacitor Cb is provided at one end of the second transmission line TL2$b$ located on the upstream side of the bias current Ibb so as to interrupt the bias current Ibb which is a direct current. One end of the capacitor Cb is connected to the current source CSb. A pulse voltage Voutb is output from the other end of the capacitor Cb connected to one end of a terminating resistor Rtb. Here, the other end of the terminating resistor Rtb is grounded.

On the other hand, as shown in FIG. 23, one end of the second transmission line TL2$b$ located on the downstream side of the bias current Ibb is grounded via a resistor Rb. The other end of the resistor Rb with one end grounded is connected to the other end of an inductor Lb with one end grounded, and the bias current Ibb flows through the inductor Lb via the second transmission line TL2b.

The bias currents Iba and Ibb may flow through the resistors Ra and Rb in a state where the inductors La and Lb are not provided. Further, the inductors La and Lb and the resistors Ra and Rb may be provided outside the cryocooler.

As shown in FIG. 23, the SQUID elements SQ1a to SQna and delay circuits DC1a to DCna are alternately connected in series on the second transmission line TL2a, and the bias current Iba flows therethrough. Similarly, the SQUID elements SQ1b to SQnb and delay circuits DC1b to DCnb are alternately connected in series on the second transmission line TL2b, and the bias current Ibb flows therethrough. Therefore, the bias currents Iba and Ibb can be made constant regardless of the value of n.

As shown in FIG. 23, the delay circuits DC1a to DCna have the same configuration as the delay circuits DC1 to DCn shown in FIG. 18. For example, the delay circuit DC1a is formed by a parasitic capacitance Cp1 of the SQUID element SQ1a, an inductor L1, and a delay line DL1 in the same manner as the delay circuit DC1.

In addition, the delay circuits DC1b to DC(n−1)b include delay lines DL1b to DL(n−1)b, which are different in delay time from DL1 to DL(n−1), instead of the delay lines DL1 to DL(n−1) in the delay circuits DC1a to DC(n−1)a. For example, the delay circuit DC1b is formed by a parasitic capacitance Cp1 of the SQUID element SQ1b, an inductor L1, and a delay line DL1b.

Similarly to the delay circuit DCn shown in FIG. 18, both the delay circuits DCna and DCnb are formed by a parasitic capacitance Cpn and an inductor Ln, but do not include a delay line. Further, as shown in FIG. 23, the parasitic capacitances of the SQUID elements SQ1a to SQna and SQ1b to SQnb are assumed to be equal to the parasitic capacitances Cp1 and Cpn of the SQUID elements SQ1 to SQn shown in FIG. 18.

In addition, the parasitic capacitances of the SQUID elements SQ1b to SQnb and the inductors in the delay circuits DC1b to DCnb may be different from the parasitic capacitances of the SQUID elements SQ1a to SQna and the inductors in the delay circuits DC1a to DCna.

Operation of Photon Detection Device

For example, as shown in FIG. 23, when the pulsed detection current I2 is output from the SSPD element connected to the first transmission line TL12, a potential difference is transiently generated across each of the SQUID elements SQ2a and SQ2b. As a result, pulse voltages Vouta and Voutb are output from one end of each of the second transmission lines TL2a and TL2b, respectively.

Assuming that a generation time of the detection current I2 is t0, an output time ta of the pulse voltage Vouta is delayed from the time t0 by a delay time due to the delay circuit DC1a. In other words, a delay time (ta−t0) of the output time ta of the pulse voltage Vouta from the time t0 is equal to the delay time Ta due to the delay circuit DC1a. Here, it is assumed that delay times of the delay circuits DC1a to DC(n−1)a are equally Ta.

Similarly, an output time tb of the pulse voltage Voutb is delayed from the time t0 by a delay time Tb due to the delay circuit DC1b. In other words, a delay time (tb−t0) of the output time tb of the pulse voltage Voutb from the time t0 is equal to the delay time due to the delay circuit DC1b. Here, it is assumed that delay times of the delay circuits DCTb to DC(n−1)b are equally Tb ($\neq$Ta).

In this case, a difference (ta−t0)−(tb−t0) between the delay time (ta−t0) of the pulse voltage Vouta and the delay time (tb−t0) of the pulse voltage Voutb is Ta−Tb.

On the other hand, the sum (ta−t0)+(tb−t0) of the delay time (ta−t0) of the pulse voltage Vouta and the delay time (tb−t0) of the pulse voltage Voutb is Ta+Tb.

For comparison, consider a case in which a detection current In is generated in the first transmission line TL1n at the time t0. In this case, the delay time (ta−t0) of the output time ta of the pulse voltage Vouta from the time t0 is equal to a delay time (n−1)Ta due to the delay circuits DCTa to DC(n−1)a. On the other hand, the delay time (tb−t0) of the output time tb of the pulse voltage Voutb from the time t0 is equal to a delay time (n−1)Tb due to the delay circuits DCTb to DC(n−1)b.

Accordingly, the difference (ta−t0)−(tb−t0) between the delay time (ta−t0) of the pulse voltage Vouta and the delay time (tb−t0) of the pulse voltage Voutb is (n−1)(Ta−Tb).

On the other hand, the sum (ta−t0)+(tb−t0) of the delay time (ta−t0) of the pulse voltage Vouta and the delay time (tb−t0) of the pulse voltage Voutb is (n−1)(Ta+Tb).

If generalized, the difference (ta−t0)−(tb−t0) between the delay time (ta−t0) of the pulse voltage Vouta and the delay time (tb−t0) of the pulse voltage Voutb is (k−1)(Ta−Tb) in a k (1<k<n)-th first transmission line TLTk. The difference (ta−t0)−(tb−t0) in delay time is equal to a difference (ta−tb) between the output times ta and tb.

In other words, a relation of ta−tb=(k−1)(Ta−Tb) is established.

Accordingly, since a relation of k=(ta−tb)/(Ta−Tb)+1 is established and Tb$\neq$Ta, a value of k is obtained based on the difference (ta−tb) between the output times ta and tb. In other words, it is possible to know which of the first transmission lines TL11 to TL1n the detection current is generated in. As a result, it is possible to specify the SSPD element from which the detection current is output.

On the other hand, the sum (ta+tb−2×t0) of the delay time (ta−t0) of the pulse voltage Vouta and the delay time (tb−t0) of the pulse voltage Voutb is (k−1)(Ta+Tb) in the k-th first transmission line TL1k.

In other words, a relation of ta+tb−2×t0=(k−1)(Ta+Tb) is established.

Accordingly, when a relation of t0={ta+tb−(k−1)(Ta+Tb)}/2 is established and the obtained value of k is substituted, the generation time t0 of the detection current can be specified based on the sum (ta+tb) of the output times ta and tb.

When the positive pulse voltage Voutp and the negative pulse voltage Voutn output from both ends are used as in the fourth embodiment shown in FIG. 18, there is a concern that the position and the time cannot be specified accurately when a plurality of detection currents are generated at almost the same time. As an example, consider a case in which the detection current is generated in the n-th first transmission line TL1n immediately after the detection current is generated in the first transmission line TL11 in FIG. 18. In such a case, two sets of pulse voltages Voutp and Voutn are generated.

Here, the positive pulse voltage Voutp due to the detection current generated earlier in the first transmission line TL11 is observed earlier than the positive pulse voltage Voutp due to the detection current generated later in the first transmission line TL1n. In other words, since the first transmission line TL11 is closer to the output terminal of the positive pulse voltage Voutp than the first transmission line TL1n, the positive pulse voltage Voutp is observed in the order in which the detection currents are generated.

However, the negative pulse voltage Voutn due to the detection current generated earlier in the first transmission line TL11 may be observed later than the negative pulse voltage Voutn due to the detection current generated later in the first transmission line TL1n. In other words, since the first transmission line TL11 is farther from the output terminal of the negative pulse voltage Voutn than the first transmission line TL1n, the negative pulse voltage Voutn may be observed in the reverse order in which the detection currents are generated.

In this way, when the order in which the detection current is generated and the order in which the pulse voltage is observed are reversed, the observed positive pulse voltage Voutp and the observed pulse voltage Voutn cannot be associated with each other in a one-to-one manner, and the position and the time of generation of the detection current cannot be specified accurately.

On the other hand, in the present embodiment, the positive pulse voltage Voutp and the negative pulse voltage Voutn are not used, and only the positive pulse voltages Vouta and Voutb are used. Therefore, the order in which the detection current is generated and the order in which the pulse voltages Vouta and Voutb are observed always coincide with each other. Accordingly, even when a plurality of detection currents are generated at almost the same time, the pulse voltages Vouta and Voutb can be associated with each other in a one-to-one manner, and the position and the time of generation of the detection current can be specified accurately.

Other configurations are the same as those of the photon detection device according to the fourth embodiment, and thus will not be described.

The present embodiment and the fifth embodiment may be combined. In other words, as the number of SQUID elements magnetically coupled to the first transmission lines TL11 to TL1n increases, the amplitudes of the pulse voltages Vouta and Voutb in the second transmission lines TL2a and TL2b may be made larger.

In addition, the position and the time of generation of the detection current may be specified using the negative pulse voltages to be output from the other ends, instead of each of the positive pulse voltages Vouta and Voutb to be output from one end of each of the second transmission lines TL2a and TL2b.

Ninth Embodiment

Figure 24:
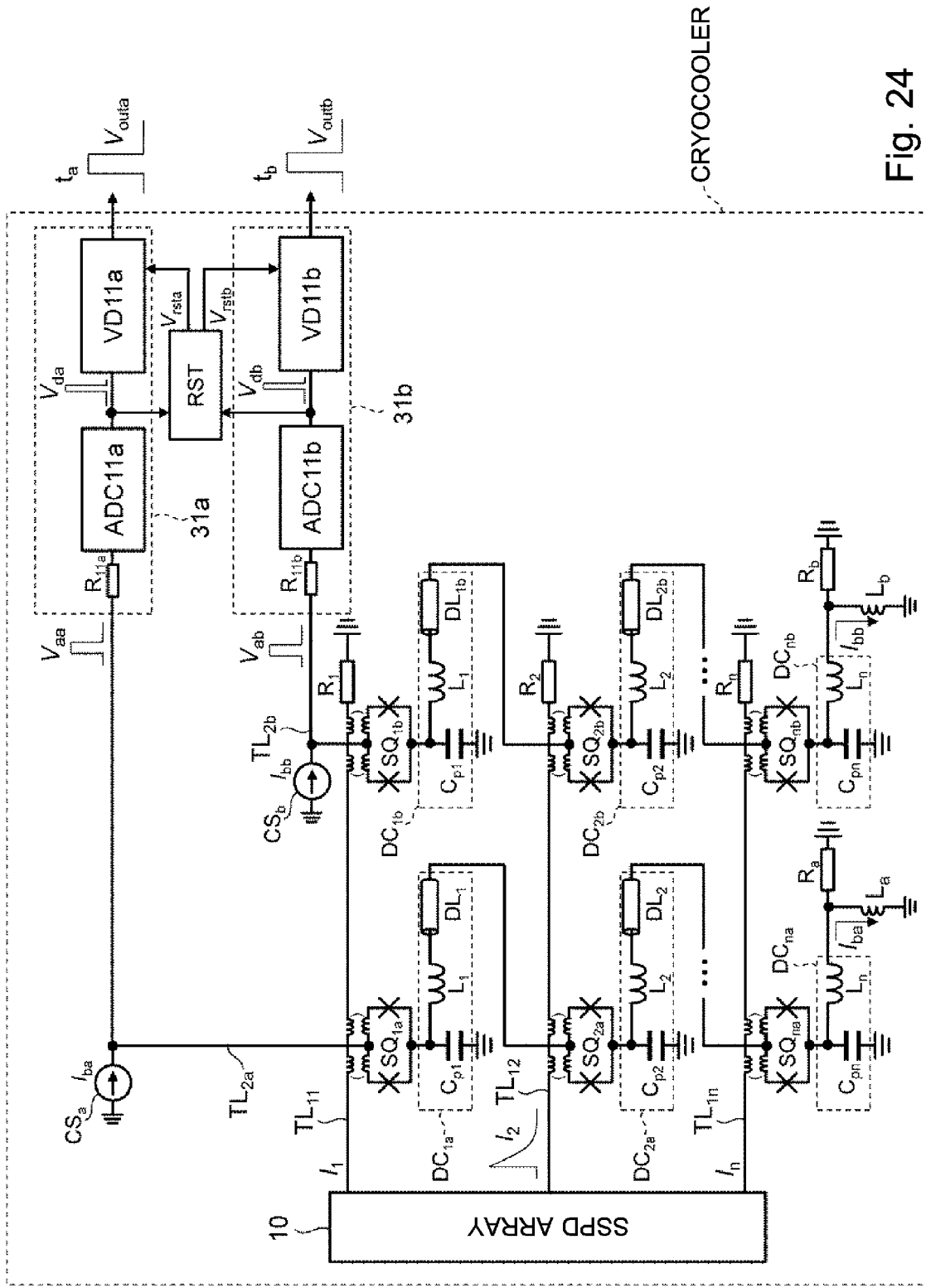
FIG. 24 is a block diagram showing a detailed configuration of a photon detection device according to a ninth embodiment.

A configuration of a photon detection device according to a ninth embodiment will be described below with reference to FIG. 24. FIG. 24 is a block diagram showing a detailed configuration of a photon detection device according to a ninth embodiment. As shown in FIG. 24, the photon detection device according to the ninth embodiment has a configuration in which the configuration according to the eighth embodiment shown in FIG. 23 is combined with the configuration according to the seventh embodiment shown in FIG. 22.

As shown in FIG. 24, in the photon detection device according to the ninth embodiment, time information generation circuits 31a and 31b and a reset circuit RST are provided in the cryocooler as compared with the photon detection device shown in FIG. 23. Further, the current sources CSa and CSb are provided outside the cryocooler in FIG. 23, but are provided inside the cryocooler in FIG. 24.

As shown in FIG. 24, the time information generation circuits 31a and 31b are respectively provided at one end of each of the second transmission lines TL2a and TL2b, and have a circuit configuration as the time information generation circuit 31 shown in FIG. 22. Specifically, the time information generation circuit 31a includes a resistor element R11a, an analog-to-digital converter ADC11a, and a voltage driver VD11a. The time information generation circuit 31b includes a resistor element R11b, an analog-to-digital converter ADC11b, and a voltage driver VD11b.

For example, as shown in FIG. 24, when a pulsed detection current I2 is output from the SSPD element connected to a first transmission line TL12, a potential difference is transiently generated across each of SQUID elements SQ2a and SQ2b. As a result, a positive analog pulse voltage Vaa is input to the analog-to-digital converter ADC11a connected to one end of a second transmission line TL2a, via a resistor R11a. The analog-to-digital converter ADC11a converts the analog pulse voltage Vaa into a digital voltage signal Vda. On the other hand, a positive analog pulse voltage Vab is input to the analog-to-digital converter ADC11b connected to one end of a second transmission line TL2b, via a resistor R11b. The analog-to-digital converter ADC11b converts the analog pulse voltage Vab into a digital voltage signal Vdb.

The voltage driver VD11a amplifies the digital voltage signal Vda, and outputs a time information signal Vouta. The time information signal Vouta is an output signal of the time information generation circuit 31a, and is extracted out of the cryocooler. Similarly, the voltage driver VD11b amplifies the digital voltage signal Vdb, and outputs a time information signal Voutb. The time information signal Voutb is an output signal of the time information generation circuit 31b, and is extracted out of the cryocooler.

The reset circuit RST generates reset signals Vrsta and Vrstb based on the digital voltage signals Vda and Vdb output from the analog-to-digital converters ADC11a and ADC11b. When both the digital voltage signals Vda and Vdb are input to the reset circuit RST, the reset circuit RST outputs the reset signals Vrsta and Vrstb.

The reset signal Vrsta is input to the voltage driver VDTTa, and the reset signal Vrstb is input to the voltage driver VDTTb. A value of the time information signal Vouta, which has been switched from "0" to "1" with the generation of the detection current I2, is reset from "1" to "0" by the reset signal Vrsta. Similarly, a value of the time information signal Voutb, which has been switched from "0" to "1" with the generation of the detection current I2, is reset from "1" to "0" by the reset signal Vrstb.

As in the eighth embodiment, the generation time of the detection current is t0, the output time (rising time) of the time information signal Vouta is ta, and the output time (rising time) of the time information signal Voutb is tb. In such a case, as in the eighth embodiment, it is possible to know which of the first transmission lines TL11 to TL1n the detection current is generated in, based on the difference (ta−tb) of the output times ta and tb. In addition, it is possible to specify the generation time t0 of the detection current based on the sum (ta+tb) of the output times ta and tb.

In the present embodiment, the time information generation circuits 31a and 31b are provided, so that the amplitudes of the output signals (time information signals Vouta and Voutb) are made large without the increase of the number of SQUID elements magnetically coupled to the first transmission lines TL11 to TL1n. In other words, the amplitude of the output signals can be made large while the increase in the circuit space is prevented.

REFERENCE SIGNS LIST

10: SSPD ARRAY
20: ADDRESS INFORMATION GENERATION CIRCUIT 30, 31, 31a, 31b, 32: TIME INFORMATION GENERATION CIRCUIT
ADC, ADC1 to ADCn, ADC31 to ADC34: ANALOG-TO-DIGITAL CONVERTER
ADC11, ADC11a, ADC11b, ADC12: ANALOG-TO-DIGITAL CONVERTER
AND: AND GATE
BE, BE30: BINARY ENCODER
BUF: BUFFER CIRCUIT
CMP1 to CMPn: COMPARATOR
C1 to C4, Ca, Cb: CAPACITOR
CS, CS1, CS11, CS31 to CS34, CSa, CSb, CSy: CURRENT SOURCE
DFF1 to DFF3: D FLIP-FLOP
Cp1 to Cpn: PARASITIC CAPACITANCE
Cp11 to Cp13, ..., Cpn1 to Cpn3: PARASITIC CAPACITANCE
DC, DC11 to DC13, ..., DC41 to DC43: DELAY CIRCUIT
DC1 to DCn, DC1a to DCna, DC1b to DCnb: DELAY CIRCUIT
DL1 to DL(n−1), DL1b to DL(n−1)b: DELAY LINE
DSC: DC-to-SFQ CONVERTER
FED: FALLING EDGE DETECTION CIRCUIT
INV: INVERTER
J1, J2, J11 to J13: JOSEPHSON JUNCTION
L1, L2, L11 to L16, L31 to L34, Lq: INDUCTOR
L11 to L13, L21 to L23, ..., Ln1 to Ln3: INDUCTOR
L, La, Lb, Ly, L1 to Ln: INDUCTOR
Lout: OUTPUT INDUCTOR
Lx1, Lx2: MAGNETIZINGEXCITATION INDUCTOR
MC1 to MCn: MAGNETIC COUPLING ELEMENT
OR, OR1, OR2: OR gate
PSC: PARALLEL-TO-SERIAL CONVERTER
QSC1 to QSC4: QFP-TO-SFQ CONVERTER
R, Ra, Rb, Rs, R1 to Rn, R31 to R33: RESISTOR ELEMENT
R11, R11a, R11b, R12: RESISTOR ELEMENT
Rt1 to Rt4, Rta, Rtb: TERMINATING RESISTOR
RED: RISING EDGE DETECTION CIRCUIT
Rm: MATCHING RESISTOR
RST: RESET CIRCUIT
SQ1 to SQn, SQ11 to SQ1k, SQ21 to SQ2k: SQUID ELEMENT
SQ11 to SQ13, ..., SQn1 to SQn3: SQUID ELEMENT
SQ1a to SQna, SQ1b to SQnb: SQUID ELEMENT
SS: SSPD ELEMENT
TL11 to TL1n: FIRST TRANSMISSION LINE
TL2, TL2a, TL2b: SECOND TRANSMISSION LINE
TL31 to TL33: THIRD TRANSMISSION LINE
TL4: FOURTH TRANSMISSION LINE
VD1, VD11, VD11a, VD11b, VD12, VD2: VOLTAGE DRIVER

The invention claimed is:

1. A photon detection device comprising:
a superconducting photon detector array in which a plurality of superconducting photon detectors are arranged;
a plurality of first transmission lines connected to the plurality of superconducting photon detectors and configured to transmit a detection current output from each of the plurality of superconducting photon detectors;
an address information generation circuit including a plurality of analog-to-digital converters connected to the plurality of first transmission lines and configured to generate, based on the detection current, an address information signal that specifies a superconducting photon detector from which the detection current is output, wherein each converter of the plurality of analog-to-digital converters includes a logic circuit configured only by an AC-driven superconducting logic circuit;
a second transmission line magnetically coupled to all of the plurality of first transmission lines; and
a time information generation circuit connected to the second transmission line and configured to generate, based on the detection current, a time information signal indicating a time at which a photon is incident on the plurality of superconducting photon detectors.

2. The photon detection device according to claim 1, wherein
the second transmission line includes a plurality of direct-current superconducting quantum interference device (SQUID) elements, and
the second transmission line is magnetically coupled to the plurality of first transmission lines via the plurality of direct-current SQUID elements.

3. The photon detection device according to claim 2, wherein
each of the plurality of direct-current SQUID elements includes an inductor between a pair of Josephson junctions,
each of the plurality of first transmission lines is provided with an inductor, and
the inductor of the direct-current SQUID element and the inductor of the first transmission line are magnetically coupled to each other.

4. The photon detection device according to claim 1, wherein the AC-driven superconducting logic circuit is an Adiabatic Quantum-Flux-Parametron (AQFP) circuit.

5. The photon detection device according to claim 1, wherein the time information generation circuit includes a logic circuit configured only by a DC-driven superconducting logic circuit.

6. The photon detection device according to claim 5, wherein the DC-driven superconducting logic circuit is a Rapid Single Flux Quantum (RSFQ) circuit.

7. The photon detection device according to claim 1, wherein the superconducting photon detector is an SSPD element.

8. A photon detection device comprising:
a superconducting photon detector array in which a plurality of superconducting photon detectors are arranged;
a plurality of first transmission lines connected to the plurality of superconducting photon detectors and configured to transmit a detection current output from each of the plurality of superconducting photon detectors;
a second transmission line magnetically coupled to all of the plurality of first transmission lines; and
a plurality of delay circuits provided between the first transmission lines adjacent to each other on the second transmission line, wherein
according to the detection current, a first pulse signal is output from one end of the second transmission line, and a second pulse signal is output from the other end of the second transmission line, and
a superconducting photon detector, from which the detection current is output, is capable of being specified based on a difference between output times of the first and second pulse signals, and a generation time of the detection current is capable of being specified based on a sum of the output times of the first and second pulse signals.

9. A photon detection device comprising:
a superconducting photon detector array in which a plurality of superconducting photon detectors are arranged;
a plurality of first transmission lines connected to the plurality of superconducting photon detectors and configured to transmit a detection current output from each of the plurality of superconducting photon detectors;
a pair of second transmission lines magnetically coupled to all of the plurality of first transmission lines; and
a plurality of delay circuits provided between the first transmission lines adjacent to each other on each of the pair of second transmission lines, wherein
according to the detection current, a first pulse signal and a second pulse signal are respectively output from one end of each of the pair of second transmission lines, and
a superconducting photon detector, from which the detection current is output, is capable of being specified based on a difference between output times of the first and second pulse signals, and a generation time of the detection current is capable of being specified based on a sum of the output times of the first and second pulse signals.

10. The photon detection device according to claim 8, wherein each of the plurality of first transmission lines is magnetically coupled to the second transmission line via at least one direct-current SQUID element provided in the second transmission line.

11. The photon detection device according to claim 8, wherein each of the plurality of first transmission lines is magnetically coupled to the second transmission line via a plurality of direct-current SQUID elements provided in the second transmission line.

12. The photon detection device according to claim 11, wherein the plurality of direct-current SQUID elements are connected in series to each other via inductors.

13. The photon detection device according to claim 10, wherein
the direct-current SQUID element includes an inductor between a pair of Josephson junctions,
each of the plurality of first transmission lines is provided with an inductor, and
the inductor of the direct-current SQUID element and the inductor of the first transmission line are magnetically coupled to each other.

14. The photon detection device according to claim 8, wherein the superconducting photon detector is an SSPD element.

15. The photon detection device according to claim 9, wherein each of the plurality of first transmission lines is magnetically coupled to the second transmission line via at least one direct-current SQUID element provided in the second transmission line.

16. The photon detection device according to claim 9, wherein each of the plurality of first transmission lines is magnetically coupled to the second transmission line via a plurality of direct-current SQUID elements provided in the second transmission line.

17. The photon detection device according to claim 16, wherein the plurality of direct-current SQUID elements are connected in series to each other via inductors.

18. The photon detection device according to claim 15, wherein
the direct-current SQUID element includes an inductor between a pair of Josephson junctions,
each of the plurality of first transmission lines is provided with an inductor, and
the inductor of the direct-current SQUID element and the inductor of the first transmission line are magnetically coupled to each other.

19. The photon detection device according to claim 9, wherein the superconducting photon detector is an SSPD element.

* * * * *